(12) United States Patent
Yang et al.

(10) Patent No.: US 9,401,216 B1
(45) Date of Patent: Jul. 26, 2016

(54) ADAPTIVE OPERATION OF 3D NAND MEMORY

(71) Applicant: SanDisk Technologies Inc., Plano, TX (US)

(72) Inventors: Niles Yang, Mountain View, CA (US);
James Fitzpatrick, Sudbury, MA (US);
Jiahui Yuan, Fremont, CA (US)

(73) Assignee: SanDisk Technologies LLC, Plano, TX (US)

( * ) Notice: Subject to any disclaimer, the term of this patent is extended or adjusted under 35 U.S.C. 154(b) by 0 days.

(21) Appl. No.: 14/861,951

(22) Filed: Sep. 22, 2015

(51) Int. Cl.
*G11C 16/16* (2006.01)
*G11C 16/26* (2006.01)
*G11C 29/00* (2006.01)
*G11C 16/04* (2006.01)

(52) U.S. Cl.
CPC ............ *G11C 16/16* (2013.01); *G11C 16/0483* (2013.01); *G11C 16/26* (2013.01); *G11C 29/70* (2013.01)

(58) Field of Classification Search
CPC  G06F 11/1076; G11C 16/16; G11C 16/0483; G11C 29/70; G11C 16/26
See application file for complete search history.

(56) References Cited

U.S. PATENT DOCUMENTS

| | | |
|---|---|---|
| 5,070,032 A | 12/1991 | Yuan et al. |
| 5,095,344 A | 3/1992 | Harari |
| 5,200,350 A | 4/1993 | Gill et al. |
| 5,238,855 A | 8/1993 | Gill |
| 5,313,421 A | 5/1994 | Guterman et al. |
| 5,315,541 A | 5/1994 | Harari et al. |
| 5,343,063 A | 8/1994 | Yuan et al. |
| 5,570,315 A | 10/1996 | Tanaka et al. |
| 5,595,924 A | 1/1997 | Yuan et al. |
| 5,661,053 A | 8/1997 | Yuan |
| 5,663,901 A | 9/1997 | Wallace et al. |
| 5,671,239 A | 9/1997 | Higashitani et al. |
| 5,768,192 A | 6/1998 | Eitan |
| 5,903,495 A | 5/1999 | Takeuchi et al. |
| 5,907,171 A | 5/1999 | Santin et al. |
| 6,011,725 A | 1/2000 | Eitan |
| 6,046,935 A | 4/2000 | Takeuchi et al. |
| 6,222,762 B1 | 4/2001 | Guterman et al. |
| 7,301,807 B2 | 11/2007 | Khalid et al. |
| 7,646,636 B2 | 1/2010 | Kim |
| 7,733,720 B2 | 6/2010 | Joshi et al. |
| 7,817,473 B2 | 10/2010 | Lee et al. |
| 7,872,929 B2 | 1/2011 | Dell et al. |
| 7,954,037 B2 | 5/2011 | Lasser et al. |
| 7,960,778 B2 | 6/2011 | Lee |

(Continued)

OTHER PUBLICATIONS

Avila et al., U.S. Appl. No. 61/731,198 entitled "Optimized Configurable NAND Parameters," filed Nov. 29, 2012, 32 pages.

(Continued)

*Primary Examiner* — Richard Elms
*Assistant Examiner* — Ajay Ojha
(74) *Attorney, Agent, or Firm* — Davis Wright Tremaine LLP

(57) ABSTRACT

In a nonvolatile memory block that contains separately-selectable sets of NAND strings, a bit line current sensing unit is configured to sense bit line current for a separately-selectable set of NAND strings of the block. A bit line voltage adjustment unit is configured to apply a first and second bit line voltages to separately-selectable sets of NAND strings that have bit line currents greater and less than the minimum current respectively, the second bit line voltage being greater than the first bit line voltage.

21 Claims, 15 Drawing Sheets

(56) References Cited

U.S. PATENT DOCUMENTS

| | | | |
|---|---|---|---|
| 8,089,811 B2 | 1/2012 | Kang et al. | |
| 8,169,827 B2 | 5/2012 | Guzzi et al. | |
| 8,291,295 B2 | 10/2012 | Harari et al. | |
| 8,472,257 B2 | 6/2013 | Dong et al. | |
| 8,569,809 B2 | 10/2013 | Thomas et al. | |
| 8,830,717 B2 | 9/2014 | Avila et al. | |
| 8,832,373 B2 | 9/2014 | Colgrove et al. | |
| 8,868,825 B1 | 10/2014 | Hayes et al. | |
| 8,891,303 B1 | 11/2014 | Higgins et al. | |
| 8,971,388 B2 | 3/2015 | Tu et al. | |
| 9,015,407 B1 | 4/2015 | Dusija et al. | |
| 9,092,363 B2 | 7/2015 | Avila et al. | |
| 9,136,022 B2 | 9/2015 | Raghu et al. | |
| 9,142,324 B2 | 9/2015 | Raghu et al. | |
| 2003/0195714 A1 | 10/2003 | Jeddeloh | |
| 2005/0160217 A1 | 7/2005 | Gonzalez et al. | |
| 2005/0219909 A1 | 10/2005 | Futatsuyama | |
| 2008/0137422 A1 | 6/2008 | Hosono | |
| 2008/0158983 A1 | 7/2008 | Mokhlesi et al. | |
| 2009/0116288 A1* | 5/2009 | Varkony | G11C 5/145 365/185.13 |
| 2009/0129146 A1 | 5/2009 | Sarin et al. | |
| 2009/0135656 A1 | 5/2009 | Park | |
| 2009/0268523 A1 | 10/2009 | Maejima | |
| 2009/0268524 A1 | 10/2009 | Maejima | |
| 2010/0023800 A1 | 1/2010 | Harari | |
| 2010/0097858 A1 | 4/2010 | Tokiwa et al. | |
| 2010/0124118 A1 | 5/2010 | Hsu et al. | |
| 2010/0157671 A1 | 6/2010 | Mokhlesi | |
| 2010/0271891 A1 | 10/2010 | Dell et al. | |
| 2011/0060862 A1 | 3/2011 | Warren | |
| 2011/0096601 A1 | 4/2011 | Gavens et al. | |
| 2011/0131473 A1 | 6/2011 | Mokhlesi et al. | |
| 2011/0211392 A1 | 9/2011 | Kim et al. | |
| 2011/0249503 A1 | 10/2011 | Yamada et al. | |
| 2011/0267885 A1 | 11/2011 | Kato | |
| 2012/0001247 A1 | 1/2012 | Alsmeier | |
| 2012/0008399 A1 | 1/2012 | Hoei et al. | |
| 2012/0057405 A1 | 3/2012 | Ogiwara et al. | |
| 2012/0069667 A1 | 3/2012 | Shirakawa | |
| 2012/0096328 A1 | 4/2012 | Franceschini et al. | |
| 2012/0170365 A1 | 7/2012 | Kang et al. | |
| 2012/0170375 A1 | 7/2012 | Sim et al. | |
| 2012/0218836 A1 | 8/2012 | Ozawa | |
| 2012/0220088 A1 | 8/2012 | Alsmeier | |
| 2012/0275233 A1 | 11/2012 | Sarin et al. | |
| 2013/0007353 A1 | 1/2013 | Shim et al. | |
| 2013/0055012 A1 | 2/2013 | Roh | |
| 2013/0073924 A1 | 3/2013 | D'Abreu et al. | |
| 2013/0094290 A1 | 4/2013 | Sridharan et al. | |
| 2013/0107628 A1 | 5/2013 | Dong et al. | |
| 2013/0268724 A1* | 10/2013 | Seo | G06F 12/0246 711/103 |
| 2013/0322174 A1 | 12/2013 | Li et al. | |
| 2014/0063902 A1 | 3/2014 | Sunkavalli et al. | |
| 2014/0133232 A1 | 5/2014 | Avila et al. | |
| 2014/0146609 A1 | 5/2014 | Avila et al. | |
| 2014/0153333 A1 | 6/2014 | Avila | |
| 2014/0359398 A1 | 12/2014 | Avila et al. | |
| 2015/0121156 A1 | 4/2015 | Raghu et al. | |
| 2015/0121157 A1 | 4/2015 | Raghu et al. | |
| 2015/0162088 A1 | 6/2015 | Dusija et al. | |

OTHER PUBLICATIONS

Avila et al., U.S. Appl. No. 61/731,215 entitled "Weighted Read Scrub for Nonvolatile Memory," filed Nov. 29, 2012, 42 pages.

Eitan et al., "NROM: a Novel Localized Trapping, 2-Bit Nonvolatile Memory Cell," IEEE Electron Device Letters, vol. 21, No. 11, Nov. 2000, pp. 543-545.

Fukuzumi et al., "Optimal integration and characteristics of vertical array devices for ultra-high density, bit-cost scalable flash memory," Electron Devices Meeting, 2007, IEDM 2007, IEEE International, IEEE, 2007.

Jung et al., "Three dimensionally stacked NAND flash memory technology using stacking single crystal Si layers on ILD and TANOS structure for beyond 30nm node," Electron Devices Meeting, 2006, IEDM'06, International, IEEE, 2006.

Kochar et al., U.S. Appl. No. 14/466,786 entitled "Zoned Erase Verify in Three Dimensional Nonvolatile Memory," filed Aug. 22, 2014, 48 pages.

Park et al., "A Fully Performance Compatible 45 mn 4-Gigabit Three Dimensional Double-Stacked Multi-Level NAND Flash Memory with Shared Bit-Line Structure," IEEE Journal of Solid-State Circuits, vol. 44, No. 1, Jan. 2009, pp. 208-216.

* cited by examiner

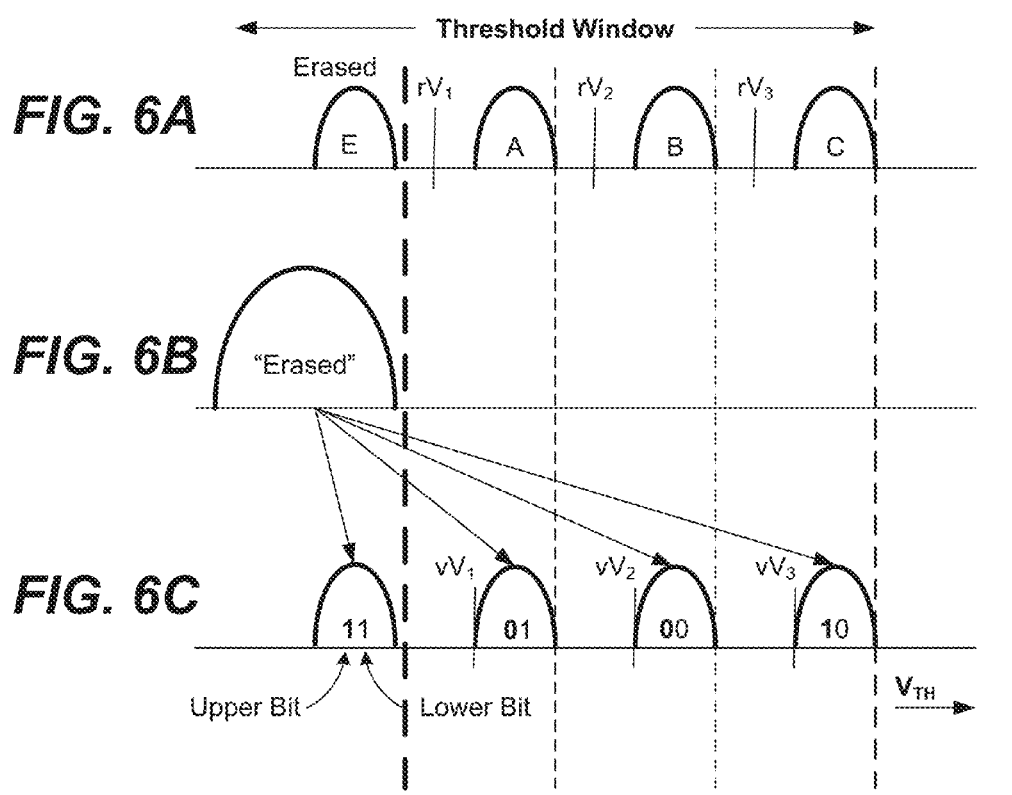

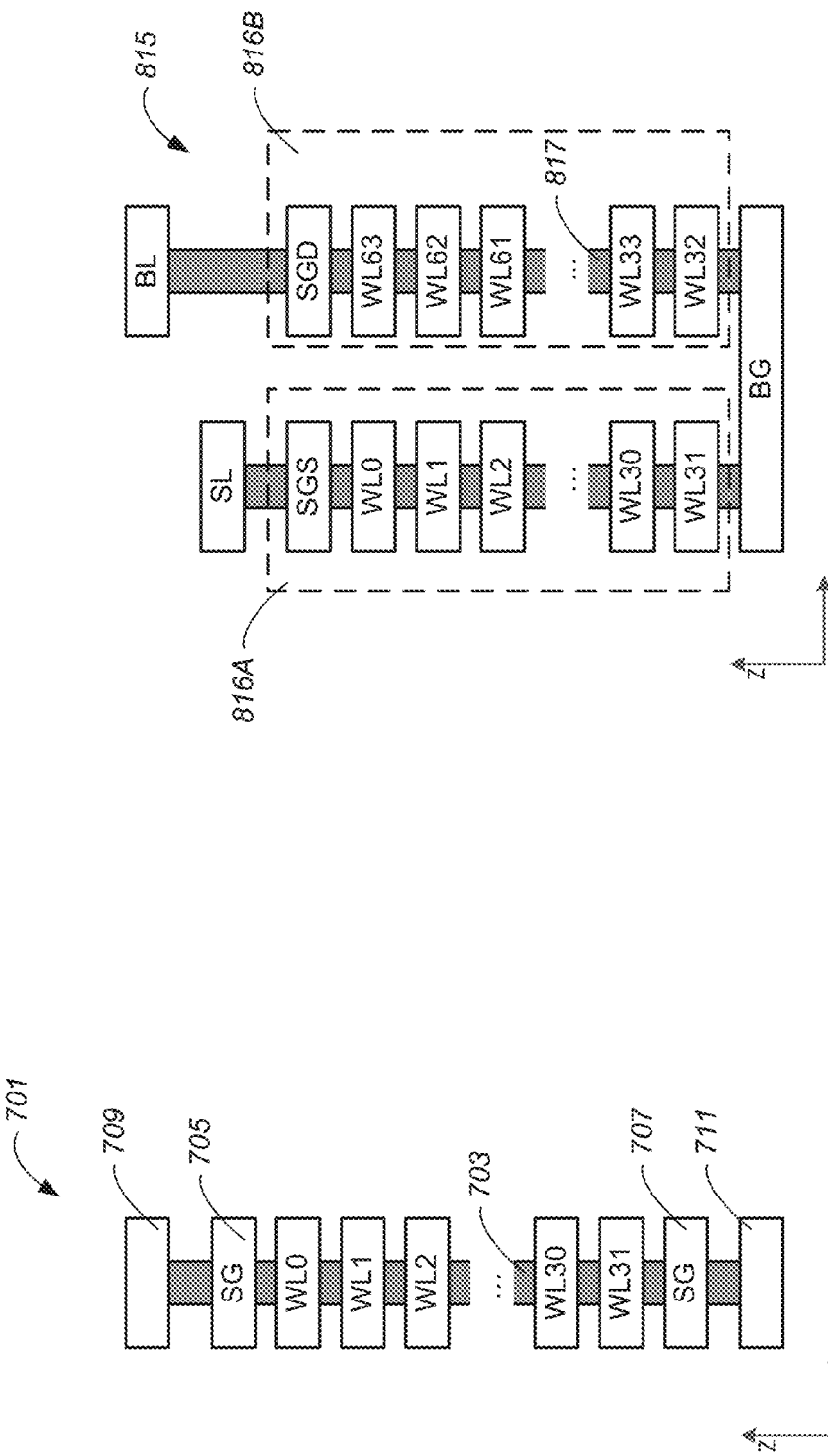

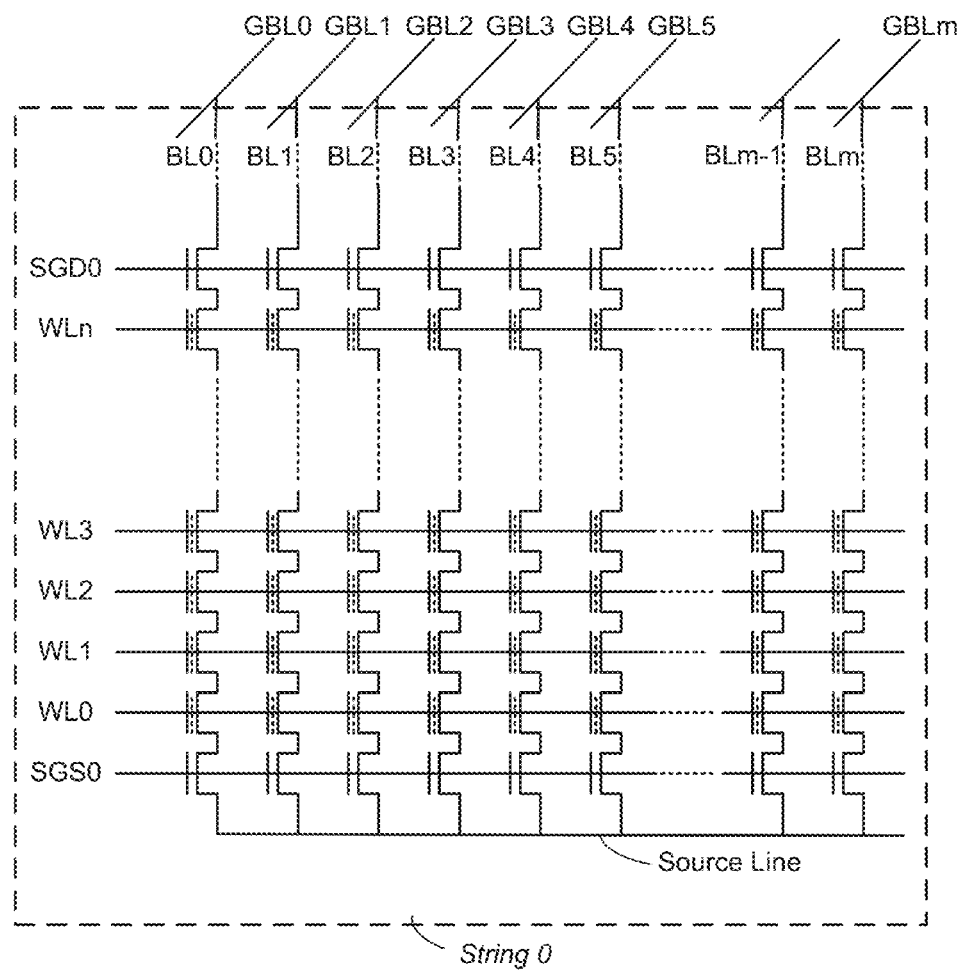
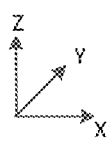
FIG. 10C

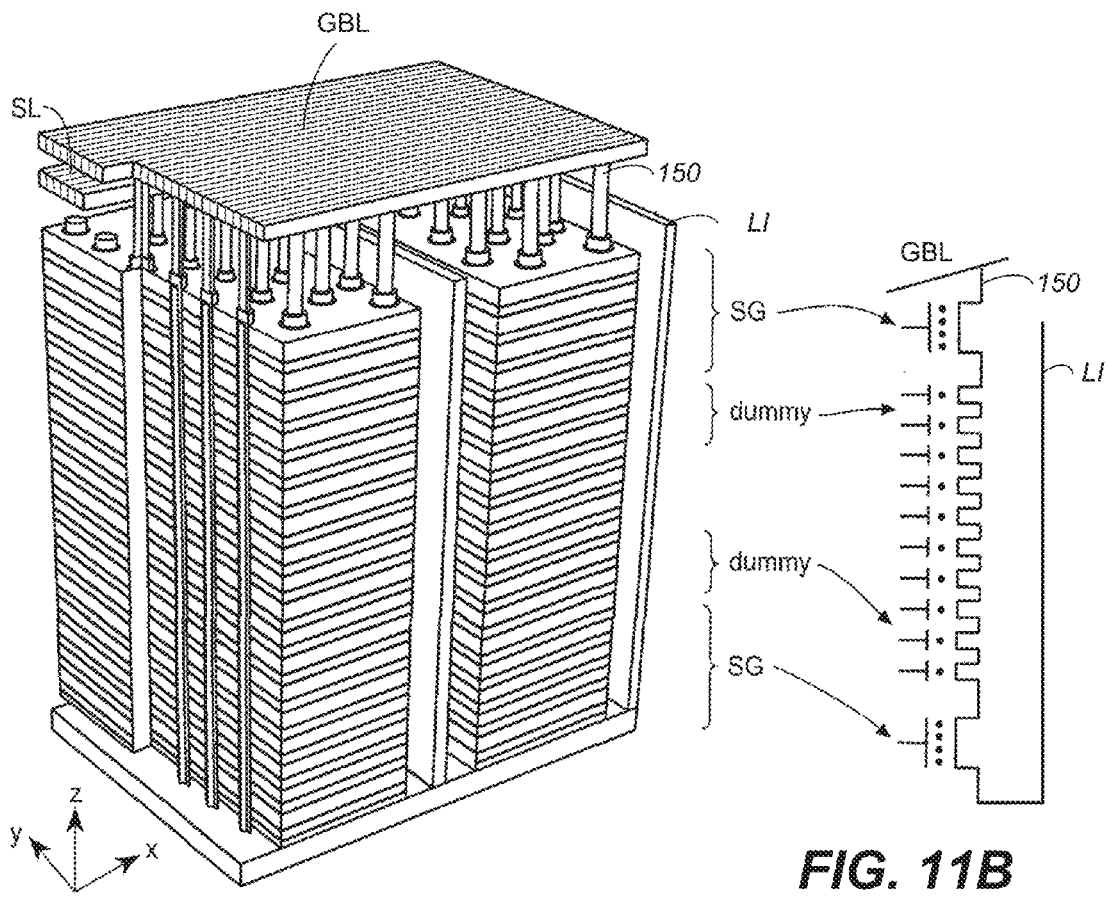
FIG. 11A
FIG. 11B
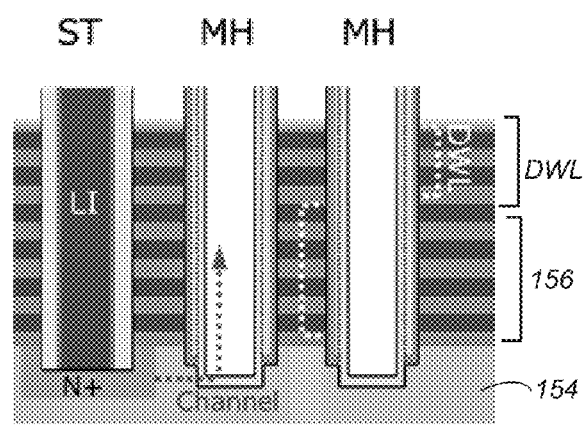
FIG. 12

ADAPTIVE OPERATION OF 3D NAND MEMORY

BACKGROUND

This application relates to the operation of re-programmable nonvolatile memory such as semiconductor flash memory.

Solid-state memory capable of nonvolatile storage of charge, particularly in the form of EEPROM and flash EEPROM packaged as a small form factor card, has become the storage of choice in a variety of mobile and handheld devices, notably information appliances and consumer electronics products. Unlike RAM (random access memory) that is also solid-state memory, flash memory is non-volatile, and retains its stored data even after power is turned off. Also, unlike ROM (read only memory), flash memory is rewritable similar to a disk storage device.

Flash EEPROM is similar to EEPROM (electrically erasable and programmable read-only memory) in that it is a non-volatile memory that can be erased and have new data written or "programmed" into their memory cells. Both utilize a floating (unconnected) conductive gate, in a field effect transistor structure, positioned over a channel region in a semiconductor substrate, between source and drain regions. A control gate is then provided over the floating gate. The threshold voltage characteristic of the transistor is controlled by the amount of charge that is retained on the floating gate. That is, for a given level of charge on the floating gate, there is a corresponding voltage (threshold) to be applied to the control gate before the transistor is turned "on" to permit conduction between its source and drain regions. Flash memory such as Flash EEPROM allows entire blocks of memory cells to be erased at the same time.

The floating gate can hold a range of charges and therefore can be programmed to any threshold voltage level within a threshold voltage window. The size of the threshold voltage window is delimited by the minimum and maximum threshold levels of the device, which in turn correspond to the range of the charges that can be programmed onto the floating gate. The threshold window generally depends on the memory device's characteristics, operating conditions and history. Each distinct, resolvable threshold voltage level range within the window may, in principle, be used to designate a definite memory state of the cell.

Nonvolatile memory devices are also manufactured from memory cells with a dielectric layer for storing charge. Instead of the conductive floating gate elements described earlier, a dielectric layer is used. An ONO dielectric layer extends across the channel between source and drain diffusions. The charge for one data bit is localized in the dielectric layer adjacent to the drain, and the charge for the other data bit is localized in the dielectric layer adjacent to the source. Multi-state data storage is implemented by separately reading the binary states of the spatially separated charge storage regions within the dielectric.

Many nonvolatile memories are formed along a surface of a substrate (e.g. silicon substrate) as two dimensional (2D), or planar, memories. Other nonvolatile memories are three dimensional (3-D) memories that are monolithically formed in one or more physical levels of memory cells having active areas disposed above a substrate.

SUMMARY

A block in a three-dimensional nonvolatile memory may include multiple separately-selectable sets of NAND strings some of which may have characteristics that are outside the normal range of characteristics for NAND strings, which may cause them to fail at some point, either during testing or during operation. For example, an erase fail may occur because current flow through a separately-selectable set of NAND strings during erase-verify is low as a result of a resistance in series with erased memory cells. Such a resistance may be, for example, due to a poor connection between the NAND string and a bit line, or between the NAND string and a common source, or may be due to one or more select transistors, or some other element. Low current due to such a resistance may be overcome by applying a higher bit line voltage. This can be done on a string by string basis, column by column basis (where a column includes multiple bit lines), or for a whole separately-selectable set of NAND strings. A record may be maintained to indicate bit line voltages to use. Low current caused by select transistors may be brought to an acceptable level by applying increased select line voltage. Data stored in portions of a block that require modified parameters such as increased bit line or select line voltages may be stored with an increased redundancy ratio to ensure that data is safely maintained.

An example of a three dimensional nonvolatile memory system includes: a block that contains a plurality of separately-selectable sets of NAND strings; a bit line current sensing unit that is configured to sense bit line current for a separately-selectable set of NAND strings of the block and to compare the bit line current to a minimum current; and a bit line voltage adjustment unit that is in communication with the bit line current sensing unit, the bit line voltage adjustment unit configured to apply a first bit line voltage to separately-selectable sets of NAND strings that have bit line currents greater than the minimum current, and configured to apply a second bit line voltage to separately-selectable sets of NAND strings that have bit line currents less than the minimum current, the second bit line voltage being greater than the first bit line voltage.

The first and second bit line voltages may be applied during programming, reading, or erasing of the block. The bit line current sensing unit may be configured to sense bit line current for each of the plurality of separately-selectable sets of NAND strings of the block and to compare each of the bit line currents with the minimum current, and the bit line voltage adjustment unit may be configured to apply at least the second bit line voltage to any of the plurality of separately-selectable sets of NAND strings in the block that have bit line currents that are less than the minimum current. A table may record an entry for each separately-selectable set of NAND strings that receives at least the second bit line voltage, an entry indicating a bit line voltage to be applied to a corresponding separately-selectable set of NAND strings. A select line voltage sensing unit may be configured to sense select line threshold voltage and to compare a select line threshold voltage with a minimum threshold voltage; and a select line voltage adjustment unit may be configured to adjust select line voltage for a select line that has a select line threshold voltage that is less than the minimum threshold voltage. A table may record an entry for each separately-selectable set of NAND strings that has a select line threshold voltage that is less than the minimum threshold voltage, an entry in the table indicating a select line voltage to be applied to a select line in a corresponding separately-selectable set of NAND strings. An adaptive data encoding unit may encode data with variable redundancy prior to storage, the adaptive data encoding unit may be configured to apply a first redundancy scheme to data stored in separately-selectable sets of NAND strings that have bit line currents greater than the minimum current, and configured to apply a second redundancy scheme to data stored in separately-selectable sets of NAND strings that have bit line currents less than the minimum current. A table may record an entry for each separately-selectable set of NAND strings that has bit line currents less than the minimum current, an entry in the table indicating a redundancy scheme to be applied to data stored in a corresponding separately-selectable set of NAND strings.

An example of a three dimensional nonvolatile memory includes: a first separately-selectable set of NAND strings in a block, data in the first separately-selectable set of NAND strings encoded with a first level of redundancy; and a second separately-selectable set of NAND strings in the block, data in the second separately-selectable set of NAND strings encoded with a second level of redundancy that provides a higher level of error correction capability than the first level of redundancy.

An adaptive encoder/decoder may be configured to encode and decode data with a variable level of redundancy according to characteristics of separately-selectable sets of NAND strings in which data is stored. A bit line adjustment unit may be configured to apply a first bit line voltage to bit lines in the first separately-selectable set of NAND strings and to apply a second bit line voltage to bit lines in the second separately-selectable set of NAND strings. Configuration of the adaptive encoder/decoder, and configuration of the bit line adjustment unit to apply the first bit line voltage and the second bit line voltage, may be in response to testing of the first and second separately-selectable sets of NAND strings. A select line adjustment unit may be configured to apply a first select voltage to a first select line in the first separately-selectable set of NAND strings and to apply a second select voltage to a second select line in the second separately-selectable set of NAND strings. The first level of redundancy and the second level of redundancy may be determined according to characteristics of the first separately-selectable set of NAND strings and the second separately-selectable set of NAND strings respectively.

An example of a method of operating a three dimensional nonvolatile memory that includes multiple separately-selectable sets of NAND strings in a block, includes: measuring electrical current through a separately-selectable set of NAND strings having a common select line; comparing the electrical current with predetermined criteria; if the current does not meet the predetermined criteria then calculating one or more bit line voltage offsets; and subsequently, adjusting bit line voltages applied to bit lines connected to the separately-selectable set of NAND strings by the one or more bit line voltage offsets while other bit line voltages applied to other separately-selectable sets of NAND strings remain unadjusted.

The one or more bit line voltage offsets may be recorded for the separately-selectable set of NAND strings. The one or more bit line voltage offsets may be recorded in a table that contains a calculated bit line voltage offset for each separately-selectable set of NAND strings having a measured current that does not meet the predetermined criteria. An enhanced redundancy scheme may be applied to data stored in sets of strings that do not meet the predetermined criteria, the enhanced redundancy scheme providing a higher degree of error correction capacity than a regular redundancy scheme that is applied to data stored in sets of strings that meet the predetermined criteria. Select gate threshold voltage may be sensed for a select line in a separately-selectable set of NAND strings; the select gate threshold voltage may be compared with a minimum threshold voltage; a select line voltage offset may be calculated for a separately-selectable set of NAND strings that have a select line threshold voltage less than the minimum threshold voltage; and the select line voltage offset may be applied to select line voltages that are subsequently applied to the select line when accessing the separately-selectable set of NAND strings.

The select line voltage offset may be recorded for the separately-selectable set of NAND strings and additional select line voltage offsets may be recorded for other separately-selectable sets of NAND strings. Data to be stored in the separately-selectable set of NAND strings may be encoded using an enhanced encoding scheme.

Various aspects, advantages, features and embodiments are included in the following description of exemplary examples thereof, which description should be taken in conjunction with the accompanying drawings.

BRIEF DESCRIPTION OF THE DRAWINGS

FIGS. 6A-6C illustrate an example of programming a population of memory cells.

FIG. 7 shows an example of a physical structure of a 3-D NAND string.

FIG. 8 shows an example of a physical structure of a U-shaped 3-D NAND string.

FIGS. 10A-C illustrate an example of a 3-D NAND memory with multiple separately-selectable sets of strings in a block.

FIGS. 11A-B illustrate vertical NAND strings.

FIG. 12 illustrates a connection of a vertical NAND string with a common source.

DETAILED DESCRIPTION

Memory System

Figure 1:
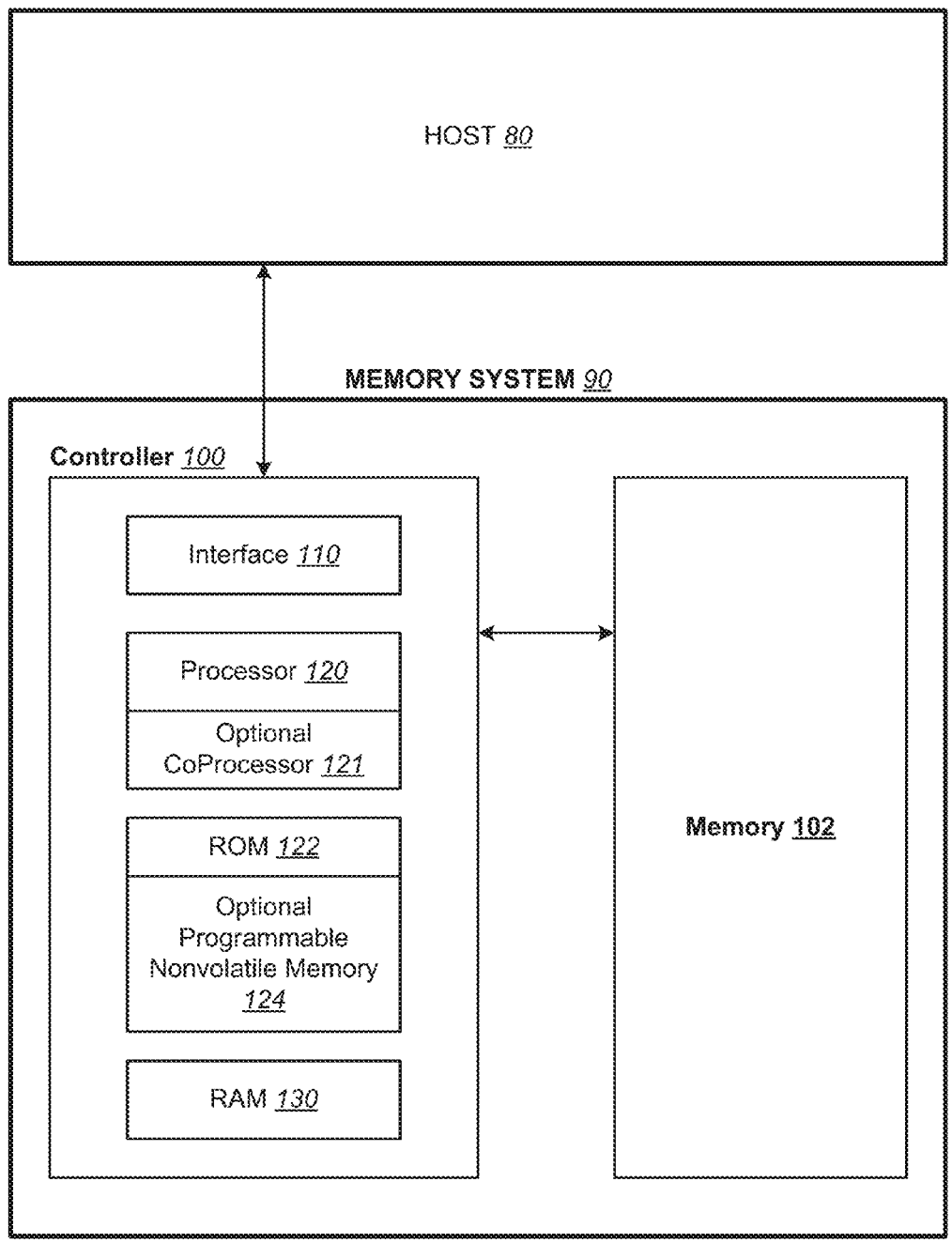
FIG. 1 illustrates schematically the main hardware components of a memory system.

Semiconductor memory devices include volatile memory devices, such as dynamic random access memory ("DRAM") or static random access memory ("SRAM") devices, non-volatile memory devices, such as resistive random access memory ("ReRAM"), electrically erasable programmable read only memory ("EEPROM"), flash memory (which can also be considered a subset of EEPROM), ferroelectric random access memory ("FRAM"), and magnetoresistive random access memory ("MRAM"), and other semiconductor elements capable of storing information. Each type of memory device may have different configurations. For example, flash memory devices may be configured in a NAND or a NOR configuration.

The memory devices can be formed from passive and/or active elements, in any combinations. By way of non-limiting example, passive semiconductor memory elements include ReRAM device elements, which in some embodiments include a resistivity switching storage element, such as an anti-fuse, phase change material, etc., and optionally a steering element, such as a diode, etc. Further by way of non-limiting example, active semiconductor memory elements include EEPROM and flash memory device elements, which in some embodiments include elements containing a charge storage region, such as a floating gate, conductive nanoparticles, or a charge storage dielectric material.

Multiple memory elements may be configured so that they are connected in series or so that each element is individually accessible. By way of non-limiting example, flash memory devices in a NAND configuration (NAND memory) typically contain memory elements connected in series. A NAND memory array may be configured so that the array is composed of multiple strings of memory in which a string is composed of multiple memory elements sharing a single bit line and accessed as a group. Alternatively, memory elements may be configured so that each element is individually accessible, e.g., a NOR memory array. NAND and NOR memory configurations are exemplary, and memory elements may be otherwise configured.

The semiconductor memory elements located within and/or over a substrate may be arranged in two or three dimensions, such as a two dimensional memory structure or a three dimensional memory structure.

In a two dimensional memory structure, the semiconductor memory elements are arranged in a single plane or a single memory device level. Typically, in a two dimensional memory structure, memory elements are arranged in a plane (e.g., in an x-z direction plane) which extends substantially parallel to a major surface of a substrate that supports the memory elements. The substrate may be a wafer over or in which the layer of the memory elements are formed or it may be a carrier substrate which is attached to the memory elements after they are formed. As a non-limiting example, the substrate may include a semiconductor such as silicon.

The memory elements may be arranged in the single memory device level in an ordered array, such as in a plurality of rows and/or columns. However, the memory elements may be arrayed in non-regular or non-orthogonal configurations. The memory elements may each have two or more electrodes or contact lines, such as bit lines and word lines.

A three dimensional memory array is arranged so that memory elements occupy multiple planes or multiple memory device levels, thereby forming a structure in three dimensions (i.e., in the x, y and z directions, where the y direction is substantially perpendicular and the x and z directions are substantially parallel to the major surface of the substrate).

As a non-limiting example, a three dimensional memory structure may be vertically arranged as a stack of multiple two dimensional memory device levels. As another non-limiting example, a three dimensional memory array may be arranged as multiple vertical columns (e.g., columns extending substantially perpendicular to the major surface of the substrate, i.e., in the y direction) with each column having multiple memory elements in each column. The columns may be arranged in a two dimensional configuration, e.g., in an x-z plane, resulting in a three dimensional arrangement of memory elements with elements on multiple vertically stacked memory planes. Other configurations of memory elements in three dimensions can also constitute a three dimensional memory array.

By way of non-limiting example, in a three dimensional NAND memory array, the memory elements may be coupled together to form a NAND string within a single horizontal (e.g., x-z) memory device levels. Alternatively, the memory elements may be coupled together to form a vertical NAND string that traverses across multiple horizontal memory device levels. Other three dimensional configurations can be envisioned wherein some NAND strings contain memory elements in a single memory level while other strings contain memory elements which span through multiple memory levels. Three dimensional memory arrays may also be designed in a NOR configuration and in a ReRAM configuration.

Typically, in a monolithic three dimensional memory array, one or more memory device levels are formed above a single substrate. Optionally, the monolithic three dimensional memory array may also have one or more memory layers at least partially within the single substrate. As a non-limiting example, the substrate may include a semiconductor such as silicon. In a monolithic three dimensional array, the layers constituting each memory device level of the array are typically formed on the layers of the underlying memory device levels of the array. However, layers of adjacent memory device levels of a monolithic three dimensional memory array may be shared or have intervening layers between memory device levels.

Then again, two dimensional arrays may be formed separately and then packaged together to form a non-monolithic memory device having multiple layers of memory. For example, non-monolithic stacked memories can be constructed by forming memory levels on separate substrates and then stacking the memory levels atop each other. The substrates may be thinned or removed from the memory device levels before stacking, but as the memory device levels are initially formed over separate substrates, the resulting memory arrays are not monolithic three dimensional memory arrays. Further, multiple two dimensional memory arrays or three dimensional memory arrays (monolithic or non-monolithic) may be formed on separate chips and then packaged together to form a stacked-chip memory device.

Associated circuitry is typically required for operation of the memory elements and for communication with the memory elements. As non-limiting examples, memory devices may have circuitry used for controlling and driving memory elements to accomplish functions such as programming and reading. This associated circuitry may be on the same substrate as the memory elements and/or on a separate substrate. For example, a controller for memory read-write operations may be located on a separate controller chip and/or on the same substrate as the memory elements.

In other embodiments, types of memory other than the two dimensional and three dimensional exemplary structures described here may be used.

FIG. 1 illustrates schematically the main hardware components of a memory system suitable for implementing some of the techniques described here. The memory system 90 typically operates with a host 80 through a host interface. The memory system may be in the form of a removable memory such as a memory card, or may be in the form of an embedded memory system. The memory system 90 includes a memory 102 whose operations are controlled by a controller 100. The memory 102 comprises one or more array of non-volatile memory cells distributed over one or more integrated circuit chip. The controller 100 may include interface circuits 110, a processor 120, ROM (read-only-memory) 122, RAM (random access memory) 130, programmable nonvolatile memory 124, and additional components. The controller is typically formed as an ASIC (application specific integrated circuit) and the components included in such an ASIC generally depend on the particular application. Memory systems may be used with a variety of hosts in a variety of different environments. For example, a host may be a mobile device such as a cell phone, laptop, music player (e.g. MP3 player), Global Positioning System (GPS) device, tablet computer, or the like. Such memory systems may be inactive, without power, for long periods during which they may be subject to various conditions including high temperatures, vibration, electromagnetic fields, etc. Memory systems for such hosts, whether removable or embedded, may be selected for low power consumption, high data retention, and reliability in a wide range of environmental conditions (e.g. a wide temperature range). Other hosts may be stationary. For example, servers used for internet applications may use nonvolatile memory systems for storage of data that is sent and received over the internet. Such systems may remain powered up without interruption for extended periods (e.g. a year or more) and may be frequently accessed throughout such periods. Individual blocks may be frequently written and erased so that endurance may be a major concern.

Physical Memory Structure

Figure 2:
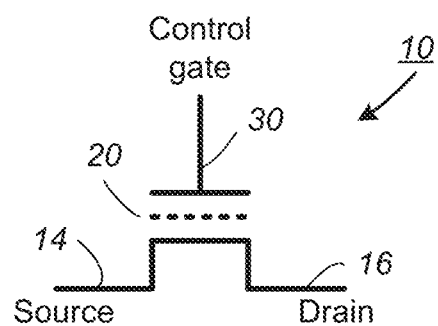
FIG. 2 illustrates schematically a non-volatile memory cell.

FIG. 2 illustrates schematically a non-volatile memory cell. The memory cell 10 can be implemented by a field-effect transistor having a charge storage unit 20, such as a floating gate or a charge trapping (dielectric) layer. The memory cell 10 also includes a source 14, a drain 16, and a control gate 30.

In practice, the memory state of a cell is usually read by sensing the conduction current across the source and drain electrodes of the cell when a reference voltage is applied to the control gate. Thus, for each given charge on the floating gate of a cell, a corresponding conduction current with respect to a fixed reference control gate voltage may be detected. Similarly, the range of charge programmable onto the floating gate defines a corresponding threshold voltage window or a corresponding conduction current window.

Alternatively, instead of detecting the conduction current among a partitioned current window, it is possible to set the threshold voltage for a given memory state under test at the control gate and detect if the conduction current is lower or higher than a threshold current (cell-read reference current). In one implementation the detection of the conduction current relative to a threshold current is accomplished by examining the rate the conduction current is discharging through the capacitance of the bit line.

Figure 3:
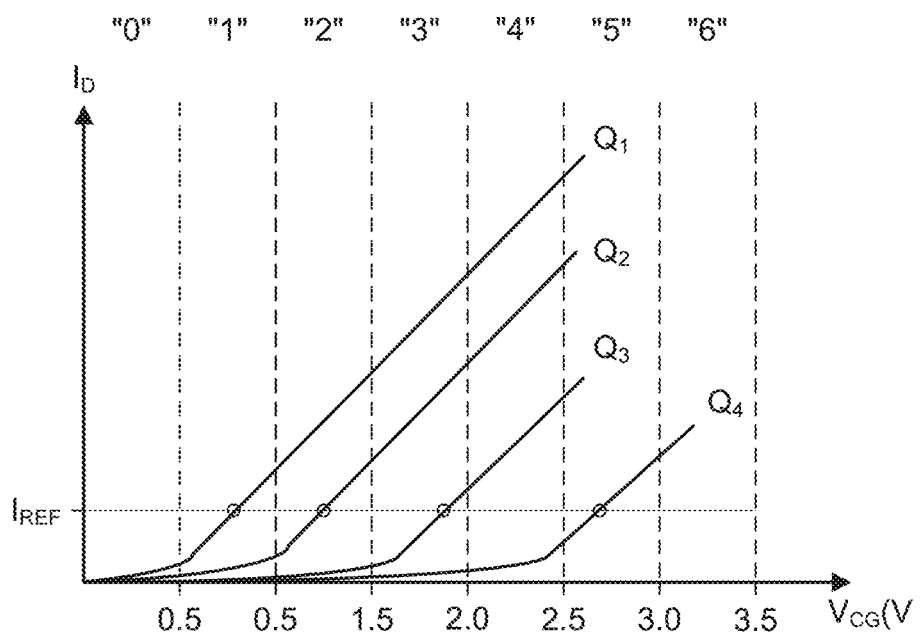
FIG. 3 illustrates the relation between the source-drain current $I_D$ and the control gate voltage $V_{CG}$ for four different charges Q1-Q4 that a floating gate may store.

FIG. 3 illustrates the relation between the source-drain current $I_D$ and the control gate voltage $V_{CG}$ for four different charges Q1-Q4 that the floating gate may be selectively storing at any one time. With fixed drain voltage bias, the four solid $I_D$ versus $V_{CG}$ curves represent four of seven possible charge levels that can be programmed on a floating gate of a memory cell, respectively corresponding to four possible memory states. As an example, the threshold voltage window of a population of cells may range from 0.5V to 3.5V. Seven possible programmed memory states "0", "1", "2", "3", "4", "5", "6", and an erased state (not shown) may be demarcated by partitioning the threshold window into regions in intervals of 0.5V each. For example, if a reference current, IREF of 2 µA is used as shown, then the cell programmed with Q1 may be considered to be in a memory state "1" since its curve intersects with $I_{REF}$ in the region of the threshold window demarcated by VCG=0.5V and 1.0V. Similarly, Q4 is in a memory state "5".

As can be seen from the description above, the more states a memory cell is made to store, the more finely divided is its threshold voltage window. For example, a memory device may have memory cells having a threshold voltage window that ranges from −1.5V to 5V. This provides a maximum width of 6.5V. If the memory cell is to store 16 states, each state may occupy from 200 mV to 300 mV in the threshold window. This will require higher precision in programming and reading operations in order to be able to achieve the required resolution.

NAND Structure

Figure 4A:
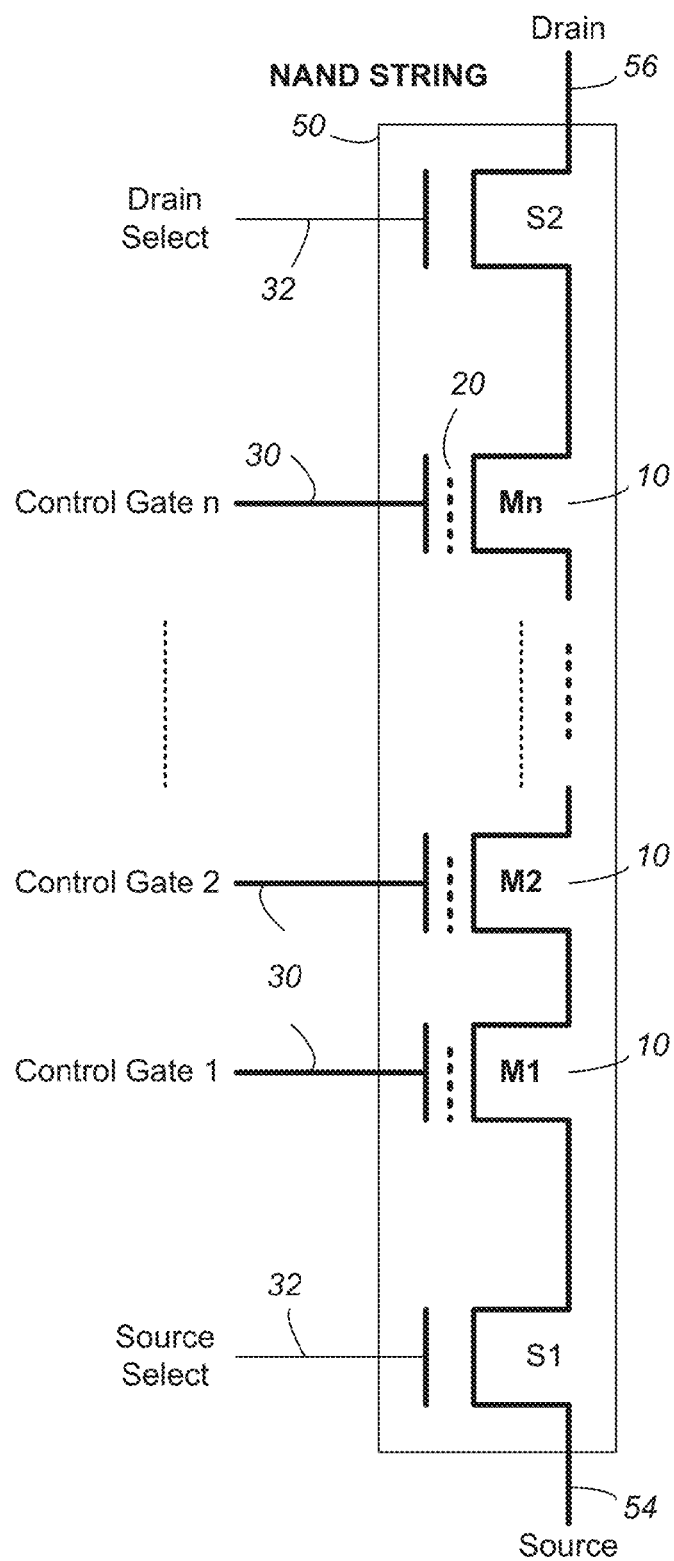
FIG. 4A illustrates schematically a string of memory cells organized into a NAND string.

FIG. 4A illustrates schematically a string of memory cells organized into a NAND string. A NAND string 50 comprises a series of memory transistors M1, M2, . . . Mn (e.g., n=4, 8, 16 or higher) daisy-chained by their sources and drains. A pair of select transistors S1, S2 controls the memory transistor chain's connection to the external world via the NAND string's source terminal 54 and drain terminal 56 respectively. In a memory array, when the source select transistor S1 is turned on, the source terminal is coupled to a source line (see FIG. 4B). Similarly, when the drain select transistor S2 is turned on, the drain terminal of the NAND string is coupled to a bit line of the memory array. Each memory transistor 10 in the chain acts as a memory cell. It has a charge storage element 20 to store a given amount of charge so as to represent an intended memory state. A control gate 30 of each memory transistor allows control over read and write operations. As will be seen in FIG. 4B, the control gates 30 of corresponding memory transistors of a row of NAND string are all connected to the same word line. Similarly, a control gate 32 of each of the select transistors S1, S2 provides control access to the NAND string via its source terminal 54 and drain terminal 56 respectively. Likewise, the control gates 32 of corresponding select transistors of a row of NAND string are all connected to the same select line.

When an addressed memory transistor 10 within a NAND string is read or is verified during programming, its control gate 30 is supplied with an appropriate voltage. At the same time, the rest of the non-addressed memory transistors in the NAND string 50 are fully turned on by application of sufficient voltage on their control gates. In this way, a conductive path is effectively created from the source of the individual memory transistor to the source terminal 54 of the NAND string and likewise for the drain of the individual memory transistor to the drain terminal 56 of the cell.

Figure 4B:
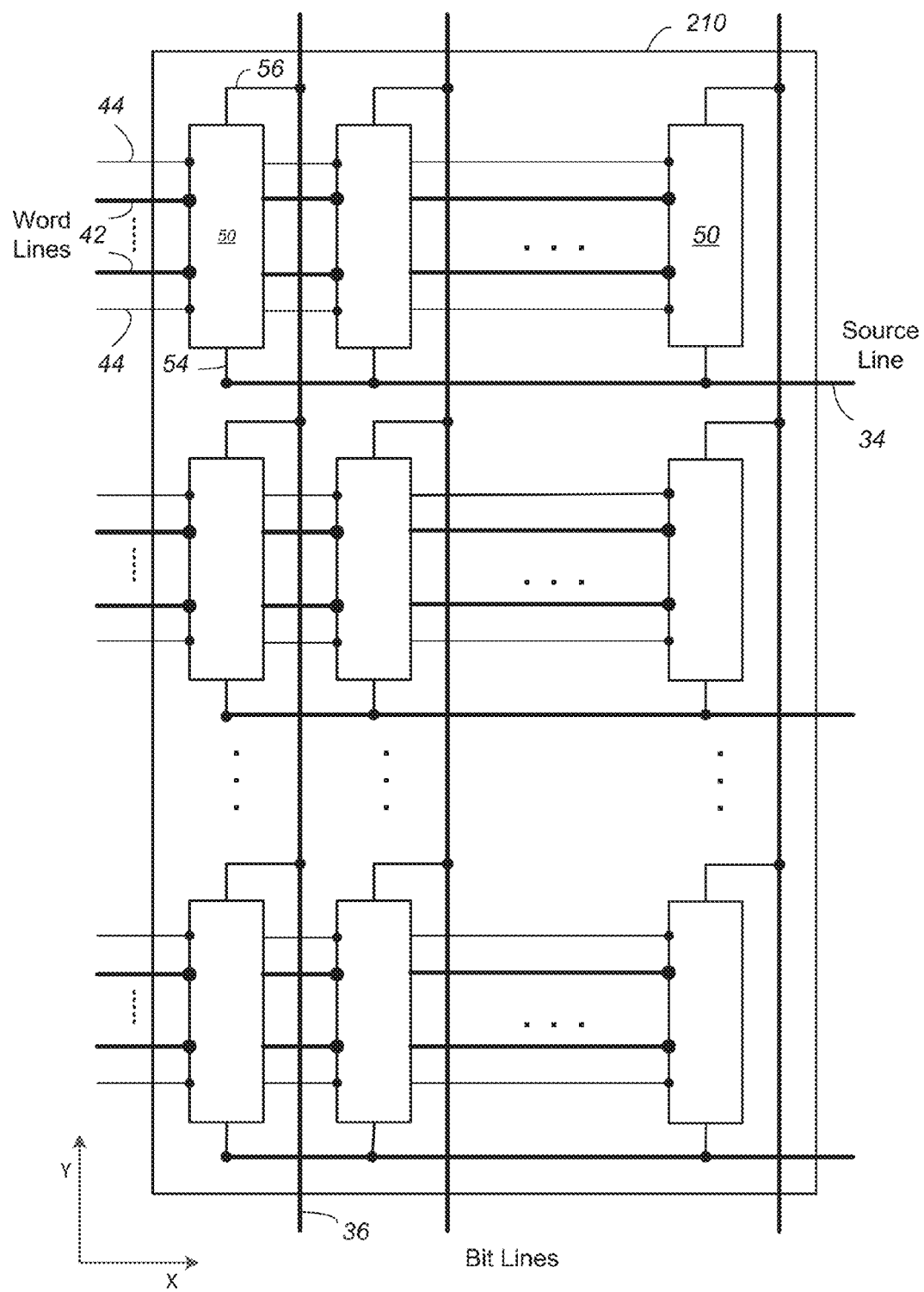
FIG. 4B illustrates an example of a NAND array 210 of memory cells, constituted from NAND strings 50 such as that shown in FIG. 4A.

FIG. 4B illustrates an example of a NAND array 210 of memory cells, constituted from NAND strings 50 such as that shown in FIG. 4A. Along each column of NAND strings, a bit line such as bit line 36 is coupled to the drain terminal 56 of each NAND string. Along each bank of NAND strings, a source line such as source line 34 is coupled to the source terminals 54 of each NAND string. Also the control gates along a row of memory cells in a bank of NAND strings are connected to a word line such as word line 42. The control gates along a row of select transistors in a bank of NAND strings are connected to a select line such as select line 44. An entire row of memory cells in a bank of NAND strings can be addressed by appropriate voltages on the word lines and select lines of the bank of NAND strings.

Figure 5:
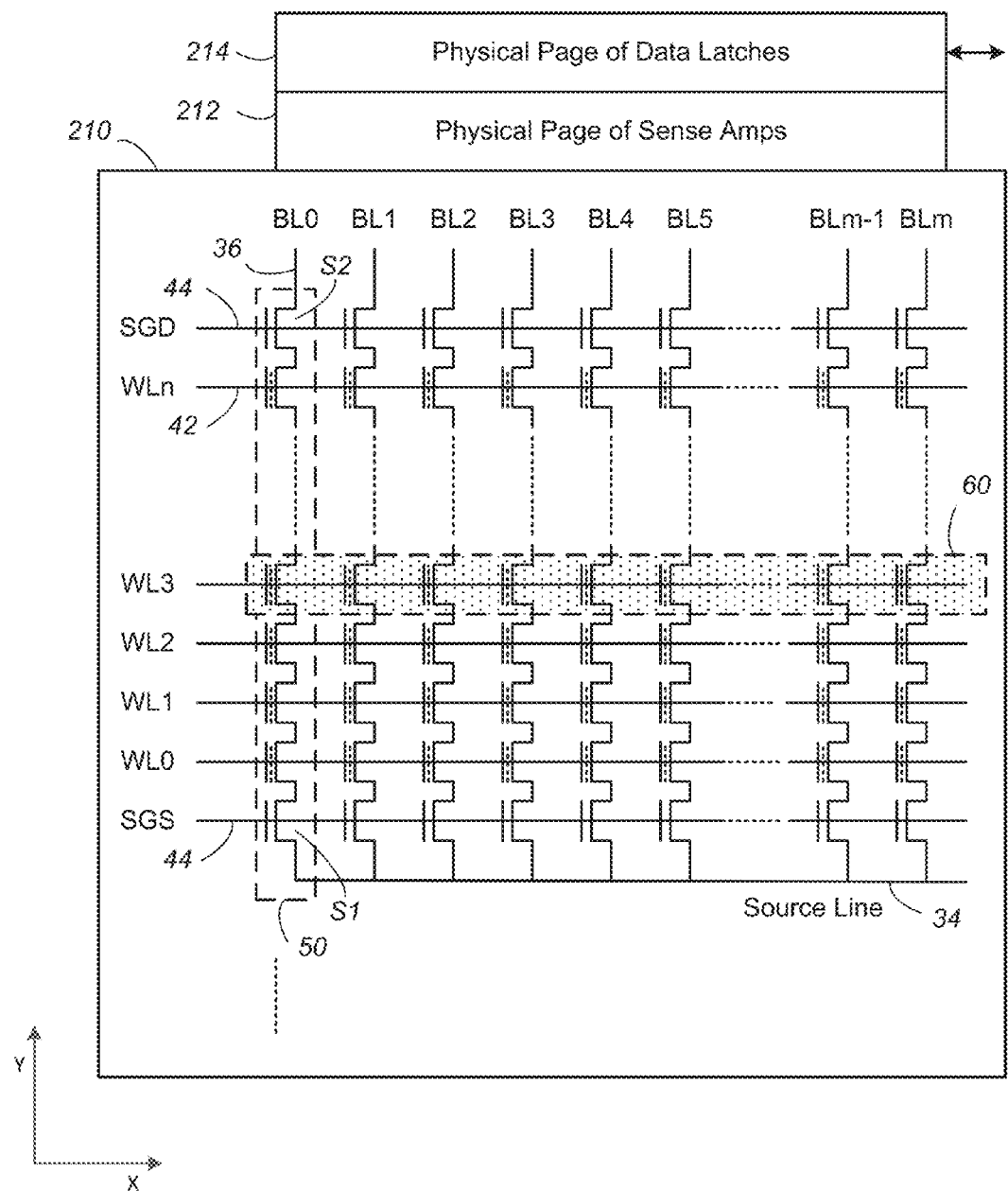
FIG. 5 illustrates a page of memory cells, organized in the NAND configuration, being sensed or programmed in parallel.

FIG. 5 illustrates a page of memory cells, organized in the NAND configuration, being sensed or programmed in parallel. FIG. 5 essentially shows a bank of NAND strings 50 in the memory array 210 of FIG. 4B, where the detail of each NAND string is shown explicitly as in FIG. 4A. A physical page, such as the page 60, is a group of memory cells enabled to be sensed or programmed in parallel. This is accomplished by a corresponding page of sense amplifiers 212. The sensed results are latched in a corresponding set of latches 214. Each sense amplifier can be coupled to a NAND string via a bit line. The page is enabled by the control gates of the cells of the page connected in common to a word line 42 and each cell accessible by a sense amplifier accessible via a bit line 36. As an example, when respectively sensing or programming the page of cells 60, a sensing voltage or a programming voltage is respectively applied to the common word line WL3 together with appropriate voltages on the bit lines.

Physical Organization of the Memory

One difference between flash memory and other of types of memory is that a flash memory cell is generally programmed from the erased state. That is the floating gate is generally first emptied of charge. Programming then adds a desired amount of charge back to the floating gate. Flash memory does not generally support removing a portion of the charge from the floating gate to go from a more programmed state to a lesser one. This means that updated data cannot overwrite existing data and is instead written to a previous unwritten location.

Furthermore erasing is to empty all the charges from the floating gate and generally takes appreciable time. For that reason, it will be cumbersome and very slow to erase cell by cell or even page by page. In practice, the array of memory cells is divided into a large number of blocks of memory cells. As is common for flash EEPROM systems, the block is the unit of erase. That is, each block contains the minimum number of memory cells that are erased together. While aggregating a large number of cells in a block to be erased in parallel will improve erase performance, a large size block also entails dealing with a larger number of update and obsolete data.

Each block is typically divided into a number of physical pages. A logical page is a unit of programming or reading that contains a number of bits equal to the number of cells in a physical page. In a memory that stores one bit per cell (a Single Level Cell, or SLC" memory), one physical page stores one logical page of data. In memories that store two bits per cell, a physical page stores two logical pages. The number of logical pages stored in a physical page thus reflects the number of bits stored per cell. The term Multi Level Cell, or "MLC" is generally used to refer to memories that store more than one bit per cell, including memories that store three bits per cell (TLC), four bits per cell, or more bits per cell. In one embodiment, the individual pages may be divided into segments and the segments may contain the fewest number of cells that are written at one time as a basic programming operation. One or more logical pages of data are typically stored in one row of memory cells. A page can store one or more sectors. A sector includes user data and overhead data.

MLC Programming

FIG. 6A-6C illustrate an example of programming a population of 4-state memory cells. FIG. 6A illustrates the population of memory cells programmable into four distinct distributions of threshold voltages respectively representing memory states "E", "A", "B" and "C". FIG. 6B illustrates the initial distribution of "erased" threshold voltages for an erased memory. FIG. 6C illustrates an example of the memory after many of the memory cells have been programmed. Essentially, a cell initially has an "erased" threshold voltage and programming will move it to a higher value into one of the three zones demarcated by verify levels $vV_1$, $vV_2$ and $vV_3$. In this way, each memory cell can be programmed to one of the three programmed states "A", "B" and "C" or remain un-programmed in the "erased" state. As the memory gets more programming, the initial distribution of the "erased" state as shown in FIG. 6B will become narrower and the erased state is represented by the "0" state.

A 2-bit code having a lower bit and an upper bit can be used to represent each of the four memory states. For example, the "E", "A", "B" and "C" states are respectively represented by "11", "01", "00" and '10". The 2-bit data may be read from the memory by sensing in "full-sequence" mode where the two bits are sensed together by sensing relative to the read demarcation threshold values $rV_1$, $rV_2$ and $rV_3$ in three sub-passes respectively.

3-D NAND Structure

An alternative arrangement to a conventional two-dimensional (2-D) NAND array is a three-dimensional (3-D) array. In contrast to 2-D NAND arrays, which are formed along a planar surface of a semiconductor wafer, 3-D arrays extend up from the wafer surface and generally include stacks, or columns, of memory cells extending upwards. Various 3-D arrangements are possible. In one arrangement a NAND string is formed vertically with one end (e.g. source) at the wafer surface and the other end (e.g. drain) on top. In another arrangement a NAND string is formed in a U-shape so that both ends of the NAND string are accessible on top, thus facilitating connections between such strings.

FIG. 7 shows a first example of a NAND string 701 that extends in a vertical direction, i.e. extending in the z-direction, perpendicular to the x-y plane of the substrate. Memory cells are formed where a vertical bit line (local bit line) 703 passes through a word line (e.g. WL0, WL1, etc.). A charge trapping layer between the local bit line and the word line stores charge, which affects the threshold voltage of the transistor formed by the word line (gate) coupled to the vertical bit line (channel) that it encircles. Such memory cells may be formed by forming stacks of word lines and then etching memory holes where memory cells are to be formed. Memory holes are then lined with a charge trapping layer and filled with a suitable local bit line/channel material (with suitable dielectric layers for isolation).

As with planar NAND strings, select gates 705, 707, are located at either end of the string to allow the NAND string to be selectively connected to, or isolated from, external elements 709, 711. Such external elements are generally conductive lines such as common source lines or bit lines that serve large numbers of NAND strings. Vertical NAND strings may be operated in a similar manner to planar NAND strings and both Single Level Cell (SLC) and Multi Level Cell (MLC) operation is possible. While FIG. 7 shows an example of a NAND string that has 32 cells (0-31) connected in series, the number of cells in a NAND string may be any suitable number. Not all cells are shown for clarity. It will be understood that additional cells are formed where word lines 3-29 (not shown) intersect the local vertical bit line.

FIG. 8 shows a second example of a NAND string 815 that extends in a vertical direction (z-direction). In this case, NAND string 815 forms a U-shape, connecting with external elements (source line "SL" and bit line "BL") located on the top of the structure. At the bottom of NAND string 815 is a controllable gate (back gate "BG") which connects the two wings 816A, 816B of NAND string 815. A total of 64 cells are formed where word lines WL0-WL63 intersect the vertical local bit line 817 (though in other examples other numbers of cells may be provided). Select gates SGS, SOD, are located at either end of NAND string 815 to control connection/isolation of NAND string 815.

Figure 9:
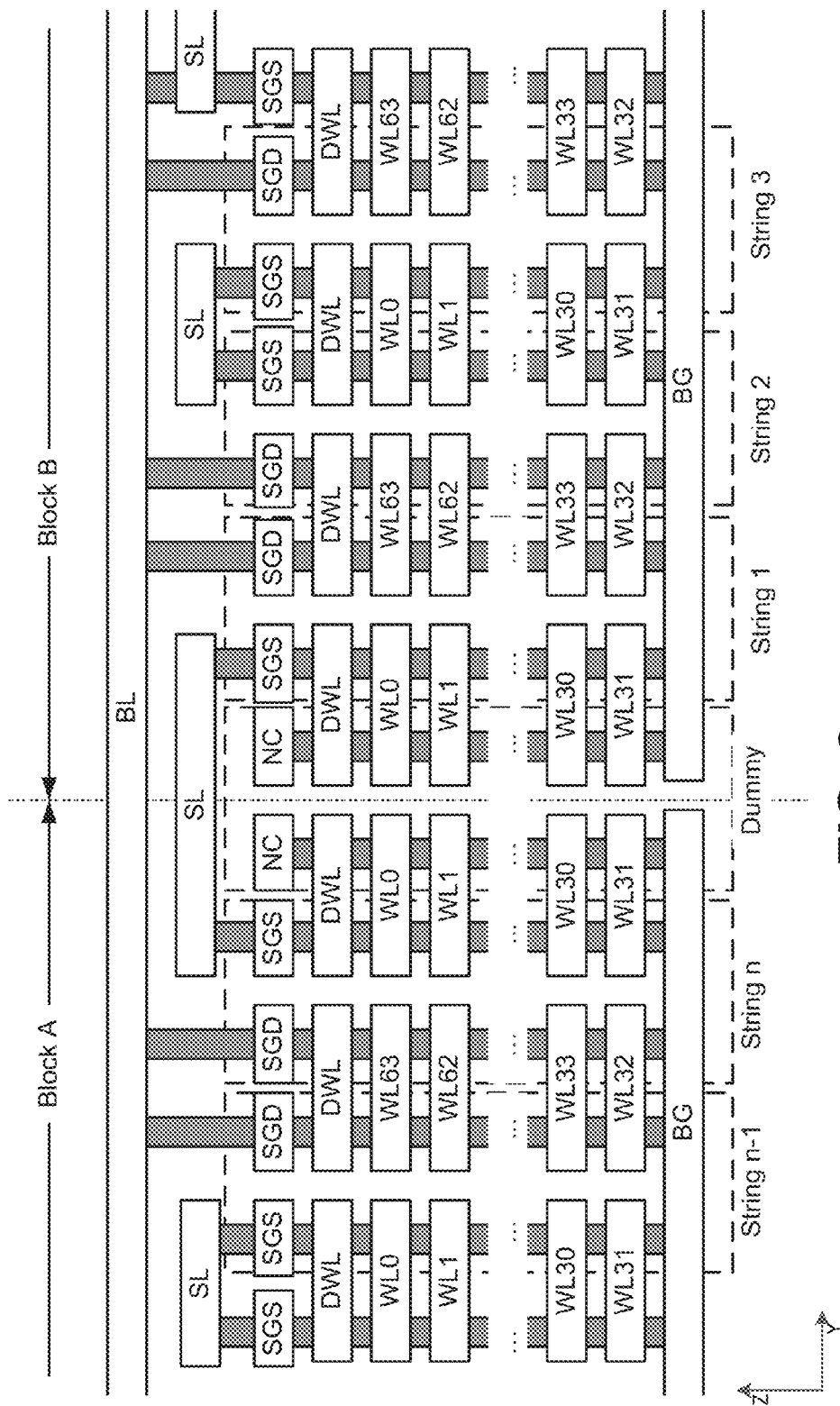
FIG. 9 shows an example of a cross section of a 3-D NAND memory array with U-shaped NAND strings in the y-z plane.

Vertical NAND strings may be arranged to form a 3-D NAND array in various ways. FIG. 9 shows an example where multiple U-shaped NAND strings in a block are connected to a bit line. In this case, there are n separately-selectable sets of strings (Sting 1-String n) in a block connected to a bit line ("BL"). The value of "n" may be any suitable number, for example, 8, 12, 16, 32, or more. Strings alternate in orientation with odd numbered strings having their source connection on the left, and even numbered strings having their source on the right. This arrangement is convenient but is not essential and other patterns are also possible.

Common source lines "SL" connect to one end of each NAND string (opposite to the end that connects to the bit line). This may be considered the source end of the NAND string, with the bit line end being considered as the drain end of the NAND string. Common source lines may be connected so that all source lines for a block may be controlled together by a peripheral circuit. Thus, NAND strings of a block extend in parallel between bit lines on one end, and common source lines on the other end.

Figure 10A:
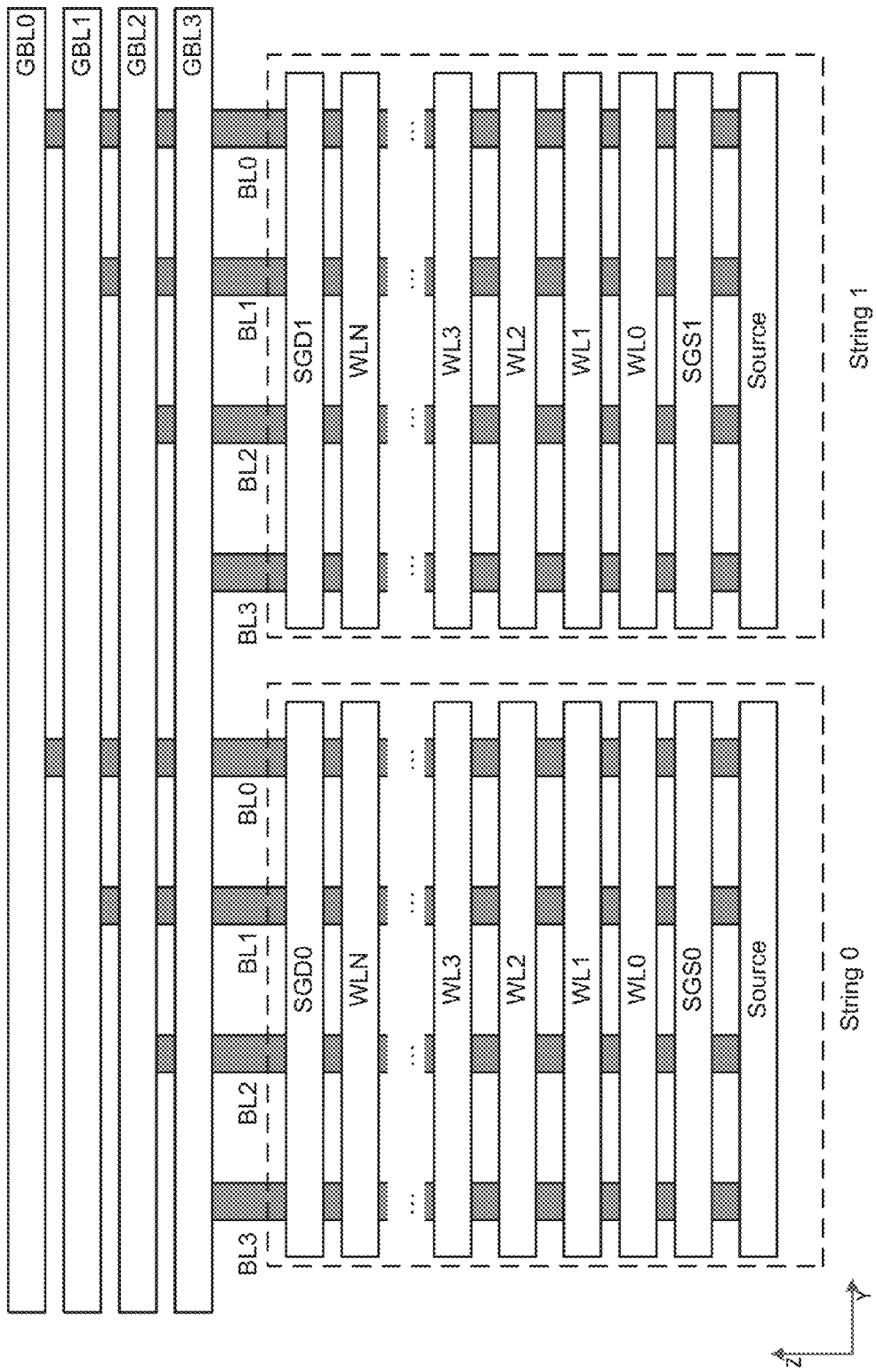

FIG. 10A shows a memory structure, in cross section along the bit line direction (along y-direction) in which straight vertical NAND strings extend from common source connections in or near a substrate to global bit lines (GBL0-GBL3) that extend over the physical levels of memory cells. Word lines in a given physical level in a block are formed from a sheet of conductive material. Memory hole structures extend down through these sheets of conductive material to form memory cells that are connected in series vertically (along the z-direction) by vertical bit lines (BL0-BL3) to form vertical NAND strings. Within a given block there are multiple NAND strings connected to a given global bit line (e.g. GBL0 connects with multiple BL0s). NAND strings are grouped into sets of strings that share common select lines. Thus, for example, NAND strings that are selected by source select line SGS0 and drain select line SGD0 may be considered as a set of NAND strings and may be designated as String 0, while NAND strings that are selected by source select line SGS1 and drain select line SGD1 may be considered as another set of NAND strings and may be designated as String 1 as shown. A block may consist of any suitable number of such separately-selectable sets of strings. It will be understood that FIG. 10A shows only portions of GBL0-GBL3, and that these bit lines extend further in the y-direction and may connect with additional NAND strings in the block and in other blocks. Furthermore, additional bit lines extend parallel to GBL0 GBL3 (e.g. at different locations along x-axis, in front of, or behind the location of the cross-section of FIG. 10A).

Figure 10B:
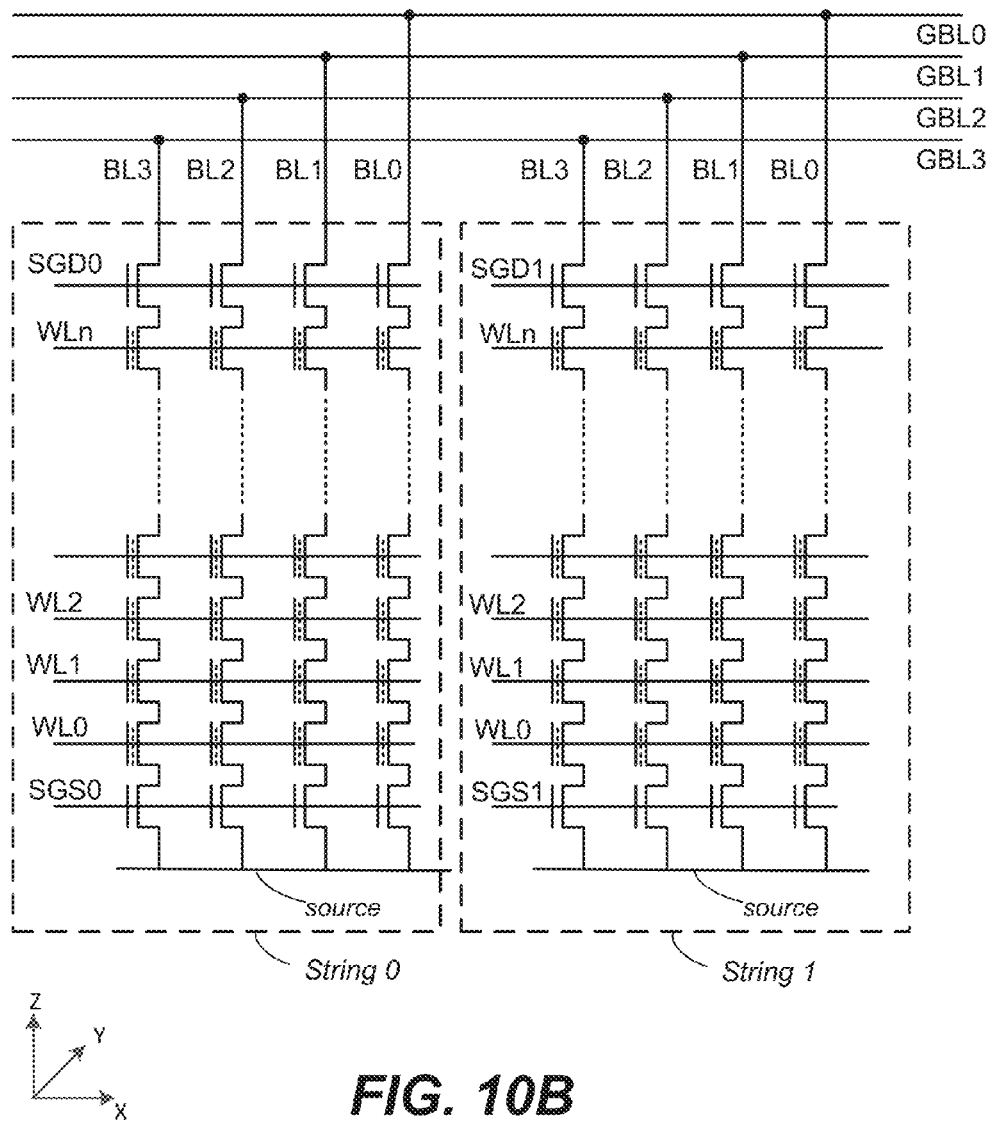

FIG. 10B illustrates separately-selectable sets of NAND strings of FIG. 10A schematically. It can be seen that each of the global bit lines (GBL0-GBL3) is connected to multiple separately selectable sets of NAND strings (e.g. GBL0 connects to vertical bit line BL0 of String 0 and also connects to vertical bit line BL0 of String 1) in the portion of the block shown. In some cases, word lines of all strings of a block are electrically connected, e.g. WL0 in string 0 may be connected to WL0 of String 1, String 2, etc. Such word lines may be formed as a continuous sheet of conductive material that extends through all sets of strings of the block. Source lines may also be common for all strings of a block. For example, a portion of a substrate may be doped to form a continuous conductive region underlying a block that is isolated from similar conductive regions underlying other blocks thus allowing separate biasing to erase a block as a unit. Source and drain select lines are not shared by different sets of strings so that, for example, SGD0 and SGS0 can be biased to select String 0 without similarly biasing SGD1 and SGS1. Thus, String 0 may be individually selected (connected to global bit lines and a common source) while String 1 (and other sets of strings) remain isolated from global bit lines and the common source. Accessing memory cells in a block during programming and reading operations generally includes applying select voltages to a pair of select lines (e.g. SGS0 and SGD0) while supplying unselect voltages to all other select lines of the block (e.g. SGS1 and SGD1). Then, appropriate voltages are applied to word lines of the block so that a particular word line in the selected set of strings may be accessed (e.g. a read voltage is applied to the particular word line, while read-pass voltages are applied to other word lines). Erasing operations may be applied on an entire block (all sets of strings in a block) rather than on a particular set of strings in a block.

FIG. 10C shows a separately selectable set of NAND strings, String 0, of FIGS. 10A-B in cross section along the X-Z plane. It can be seen that each global bit line (GBL0-GBLm) is connected to one vertical NAND string (vertical bit line BL0-BLm) in String 0. String 0 may be selected by applying appropriate voltages to select lines SGD0 and SGS0. Other sets of strings are similarly connected to global bit lines (GBL0-GBLm) at different locations along the Y direction and with different select lines that may receive unselect voltages when String 0 is selected.

Bad Blocks, Bad Columns, Bad Rows

In some memory systems, bad blocks are detected and are marked so that they are not subsequently used for storage of user data. For example, detection and marking of bad blocks may be performed during factory testing. A bad block may be a block that fails to meet a set of criteria related to, for example, reading, writing, and/or erasing (e.g. failing to read, write, or erase within time limit), having an excessively high error rate or an excessive number of bad cells, and/or other criteria. If a particular die has more than a threshold number of bad blocks then the die may be discarded. In some cases, dies may be classified according to the number of bad blocks that they contain. Generally, dies with fewer bad blocks are preferable because data storage capacity of the memory is reduced by the number of bad blocks.

In some cases, blocks may have some inoperable components while other components remain operable. For example, one or more column in a block may be found to be inoperable and may be replaced by a spare column. Similarly, one or more rows of memory cells may be replaced in some cases. Small numbers of bad cells may be acceptable if the error rates resulting from such bad cells are low enough to allow correction by Error Correction Code (FCC) or some other form of redundancy.

In an example, blocks with multiple separately-selectable sets of strings that are identified as "bad" blocks are further tested to determine if there are operable sets of strings in the blocks (e.g. some sets of strings may meet test criteria even though the bock as a whole does not meet the criteria). While some failure modes may result in bad blocks that have no operable cells, other failure modes may affect a particular portion of a block and may leave at least some operable memory cells. Some failure modes may affect individual separately-selectable sets of NAND strings within a block while other sets of NAND strings remain operable. Testing of blocks identified as "bad" blocks may identify a number of blocks that contain a mix of operable and inoperable portions. In some cases, such partially-bad blocks may subsequently be used to store data thereby increasing the capacity of the memory. In some cases, portions of blocks that fail to meet testing criteria may be reconfigured so that that they meet the testing criteria. For example, a portion of a memory that fails testing when default operating parameters are used may pass when some modified operating parameters are used.

One failure mode may be encountered when a block or a portion of a block fails to erase. Such erase fails may be detected during testing or after some significant use (e.g. after a block has been used to store user data for a period of time). In general, after a block is subject to an erase step, an erase-verify step is used to determine if memory cells are in the erased condition, or if further erasing is needed. While an erase step may apply erase conditions to all memory cells of a block so that the block is erased as a unit, erase-verify may be applied to a portion of the block. For example, one separately-selectable set of NAND strings in a block may be selected for erase-verify at a time. By applying appropriate select and deselect voltages to select lines of a block, a particular set of NAND strings may be selected while other sets of NAND strings are deselected. Appropriate erase-verify voltages may be applied to all word lines so that all cells are turned on, which should allow current flow through NAND strings. This current may be measured to determine if the memory cells are erased. If the number of NAND strings in a selected set of NAND strings that are not adequately erased (e.g. that do not have a current greater than a minimum current) is greater than a maximum allowable number then another erase step may be performed, followed by another erase-verify step. In general, erase and erase-verify steps are repeated until a maximum time or a maximum number of cycles is reached. When such a maximum is reached an erase failure may be reported and the set of NAND strings may be considered bad (and the block may be considered a bad block in some cases).

In some cases, erase failure occurs because memory cells fail to erase (remain programmed) even after a number of erase cycles. In other cases, an erase failure may occur for other reasons. A NAND string may fail an erase-verify step even though memory cells are adequately erased. For example, current through a NAND string may remain low because of some component other than a memory cell contributes significantly to the resistance of the NAND string causing current through the NAND string to remain below a minimum current. For example, select transistors may contribute significant resistance in some cases. In some cases, connections at ends of NAND strings may contribute significant resistance. For example, there may be poor connections where NAND strings connect to a common source or to global bit lines, which may provide a relatively high resistance that reduces current flow through a NAND string.

FIG. 11A illustrates a portion of a 3-D block of NAND strings including separately-selectable sets of NAND strings. Metal contacts (e.g. contact 150) extend between drain select transistors (select gate "SG") and global bit lines ("GBL"). In some cases, these contacts may have higher resistance than normal, e.g. because of process related variation, which may result in lower current through the corresponding NAND string.

FIG. 11B illustrates an individual NAND string of FIG. 11B including its connection to a corresponding global bit line ("GBL") and its source connection through the underlying substrate and through a vertical conductor, or Local Interconnect ("LI") that connects the source line in the substrate with the memory's source terminal. Resistance at any point along the current path shown may result in low current through the NAND string. For example, resistance at the top of the NAND string where it connects to the global bit line (GBL) at contact 150, at the bottom of the NAND string where it connects to the source area in the substrate, or where the source area in the substrate connects with the vertical common source connection (LI). Resistance may also result from defective select transistors (either source select transistors or drain select transistors), or defective dummy cells. Increased resistance may be specific to an individual NAND string, e.g. resistance due to a poor connection between the NAND string and a global bit line. Increased resistance may be common to multiple NAND strings, e.g. resistance due to a poor connection between the source area in the substrate and a vertical common source connection may affect an entire separately-selectable set of NAND strings.

FIG. 12 illustrates an example of memory holes ("MH") connecting to a common source area 154 in a substrate. Current flows through vertical Local Interconnect ("LI") that is formed in a source terminal ("ST"), through an N+ doped area, common source area 154, and through the channels of vertical NAND strings formed in the memory holes. Current flow through a given memory hole is controlled by select transistors, e.g. source select transistors 156 shown. Dummy word lines ("DWL") control dummy memory cells which are connected in series with memory cells that store user data.

Low Bit Line Current

Figure 13:
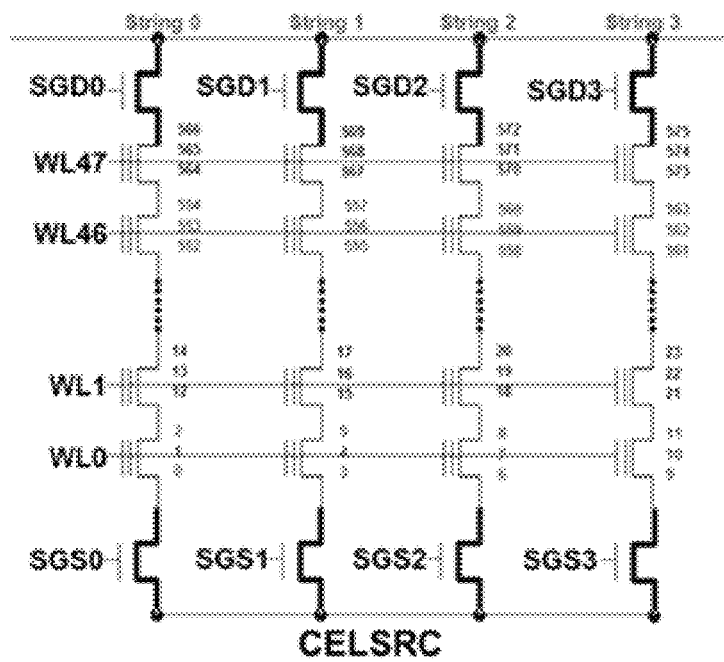
FIG. 13 shows an example of a block with four separately-selectable sets of NAND strings.

FIG. 13 illustrates four separately-selectable sets of NAND strings of a block, Strings 0-3, schematically. An example of an operation to reclaim bad portions of such a block may be directed to one set of NAND strings at a time and may apply different solutions to different sets of NAND strings. For example, when a block fails to erase (e.g. erase-verify indicates a number of NAND strings with unacceptably low current that exceeds a maximum number) then the cause of such low current flow may be investigated by individually testing sets of NAND strings. During such testing, the set of string is selected by applying appropriate select line voltages while other select lines of the same block receive unselect voltages. A read operation may proceed word line by word line to determine if memory cells are in the erased state. Where current flow through a NAND string is low, and all, or substantially all, of the memory cells are erased, this generally indicates that the low current is caused by another element, such as resistance of another component. By identifying such resistance, an appropriate solution may be identified and applied so that the NAND string may be reclaimed and subsequently used to store data.

In some cases, low current flow through NAND strings may be overcome by applying higher bit line voltage. Where a default bit line voltage fails to generate a required current flow due to some resistance, an increased bit line voltage may be enough to provide the required current flow according to the equation $V=I/R$. Thus, one solution may include applying a higher bit line voltage to the global bit line of a NAND string that has low current flow. This may be done on a bit line by bit line basis where a relatively small number (e.g. fewer than a threshold number) of NAND strings in a separately-selectable set of NAND strings have low current flow. In some memory systems, bit lines are grouped into columns, where a column may include, for example, 8, 16, 32 or more bit lines. Higher bit line voltage may be applied on a column by column basis. In some cases, where a relatively large number of NAND strings (e.g. greater than a threshold number) in a separately-selectable set of NAND strings have low flow, then increased bit line voltage may be applied to all NAND strings in the set of NAND strings. A record may be maintained to indicate that modified bit line voltages are to be applied when accessing a separately-selectable set of NAND stings. A single increased bit line voltage may be used throughout such a set, or different increased bit line voltages may be used for different columns or for individual NAND strings, e.g. a set of different bit line voltage offsets may be obtained to adjust different bit line voltages to provide adequate current. A record may have a single entry for a set of separately-selectable NAND strings or may have an entry for a column, which may include multiple bit lines, or may have individual entries for bit lines that require increased voltage. Entries may be one-bit entries that indicate an increased bit line voltage, or may be larger entries that indicate the magnitude of an increased bit line voltage.

Figures 14A, 14B:
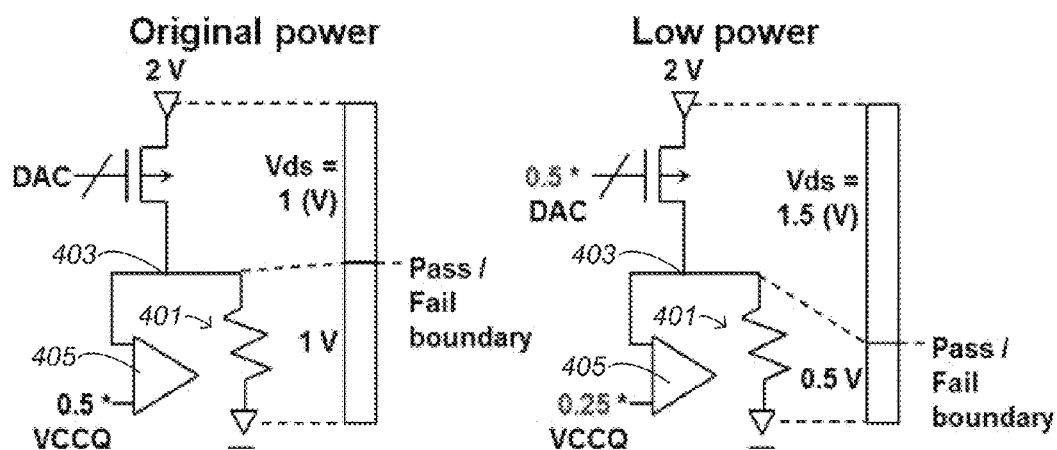
FIGS. 14A-B show examples of a current measurement circuit.

FIGS. 14A-B shows an example of a circuit for testing NAND strings. When memory cells in a separately-selectable set of NAND strings are read and confirmed as being erased, this circuit may be used to measure current and to identify an increased bit line voltage that may provide adequate current through a NAND string. The resistance 401 shown in this circuit diagram is the component being tested and may include one or more NAND strings (with memory cells turned on) along with components connected in series with the NAND string. A digital to analog converter (DAC) controls the gate of a transistor connected to a fixed voltage (2 volts in this example) to control the current through the NAND string. A comparator 405 compares the voltage at the input node 403 with a predetermined voltage (0.5*VCCQ, or 1 volt, in the example of FIG. 14A). If the voltage at the input node exceeds one volt, then the current through the NAND string is below the pass/fail boundary. By modifying the voltage applied to the input node 403 through the transistor, an appropriate voltage may be found that provides adequate current through the NAND string. The resistance of a NAND string may be obtained by finding the voltage of the input node when applying a fixed current so that an appropriate voltage can be applied to generate the required current. For example, a NAND string may have a resistance of five hundred to a thousand kilo Ohms (500 kΩ to 1MΩ). Higher resistance NAND strings may receive a bit line voltage that is increased to compensate for the increased resistance (i.e. for a given value of R, some value of V may produce adequate current according to $I=V/R$).

Testing may be performed under different conditions and test results may be compared with various criteria including current flow under different conditions. For example, as shown in FIG. 14B, low power testing may apply a relatively low current, so that the expected voltage at the input node is correspondingly less, and the comparator voltage is reduced (to 0.25VCCQ, or 0.5 volts, in this example). Testing different conditions may allow bit line voltage offsets to be used more precisely. For example, a bit line voltage offset may be used for some operations but not for others. For example, a bit line voltage offset may be used for erasing (relatively high current) but may not be used for reading (relatively low current). An appropriate testing scheme may be applied according to the currents that are used when accessing the memory (i.e. currents used in erase, read, and write operations).

In some cases, increased NAND string resistance may be caused by select transistors. Generally, because select lines are shared by all NAND strings in a separately-selectable set of NAND strings, select line issues may affect most or all NAND strings of a separately-selectable set of NAND strings. In an example, a set of NAND strings that shows a high number of NAND strings with low current (high resistance) is tested to see if higher select line voltage may overcome the problem. Increased select line voltages may be tested to see if the number of high resistance NAND strings can be reduced to an acceptable number. If increased select line voltage reduces the number of high resistance NAND strings sufficiently, then this indicates that select transistors are a substantial cause of resistance. Subsequently, access to the set of NAND strings may use an increased select line voltage for at least one select line. A record may be maintained to indicate that an increased select line voltage is required for this separately-selectable set of NAND strings and subsequent access operations may use the increased select line voltage accordingly. In some cases, a single increased select line voltage may be used for any separately-selectable set of NAND strings that can be fixed in this way. In other cases, select line voltage may be increased by different amounts according to results of testing. It may be preferable to use lower select line voltages where possible so that a range of select line voltages may be applied depending on the severity of the problem encountered in different separately-selectable sets of NAND strings.

In some cases, a portion of a block may be reclaimed by combining approaches, e.g. by applying increased select line voltage and increasing bit line voltage. It will be understood that these approaches are not exclusive and may be applied in any manner that is effective including by combining with other approaches.

In some examples, where a portion of a block is suspected of being defective in some way, additional steps may be taken to protect the data stored in such a portion. For example, a higher level of redundancy may be applied to data stored in such a portion than other portions. A memory system that encodes data using a default encoding scheme with a certain error correction capacity may encode data for storage in a suspect area with an enhanced encoding scheme what has a higher error correction capacity. For example, a first error correction code (ECC) scheme may be applied as a default scheme to data stored in the memory array, while a second ECC scheme with a higher redundancy ratio (and thus greater error correction capacity) may be applied to data stored in suspect areas. In some cases an additional redundancy scheme may be applied to data stored in suspect portions. For example, in addition to a default ECC scheme, another redundancy scheme may be added to particular portions of data. An example of such an additional scheme is an exclusive OR (XOR) scheme that is applied to a number of portions of data, and which allows one of the portions to be recalculated from the other portions and the redundancy data. An increased redundancy ratio may be the result of an enhanced redundancy scheme or of an additional redundancy scheme that is selectively applied to data in suspect areas.

An area may be considered suspect and data stored in the area may be subject to additional measures for a number of reasons. Where a portion of a block, such as a separately-selectable set of NAND strings, fails to meet some criteria such as having a high number of NAND strings with low current flow, the portion may be considered suspect. A higher than usual select line voltage may be used and/or a higher than usual bit line voltage may be applied and/or a higher redundancy ratio may be applied to stored data. A table may be maintained that indicates which portions of a block should have data encoded with an increased redundancy ratio. In some cases, such a table may be combined with a table that indicates other operating parameters such as increased bit line voltage and/or increased select line voltage. Where a block contains suspect portions, access time may be increased, e.g. because of additional encoding and configuration time, and the risk of data loss may be higher. Therefore, such blocks may be maintained as reserve blocks that are only used when there are no good blocks available. Thus, user data may only be stored in such blocks after all good blocks are used so that performance is not affected.

Figure 15:
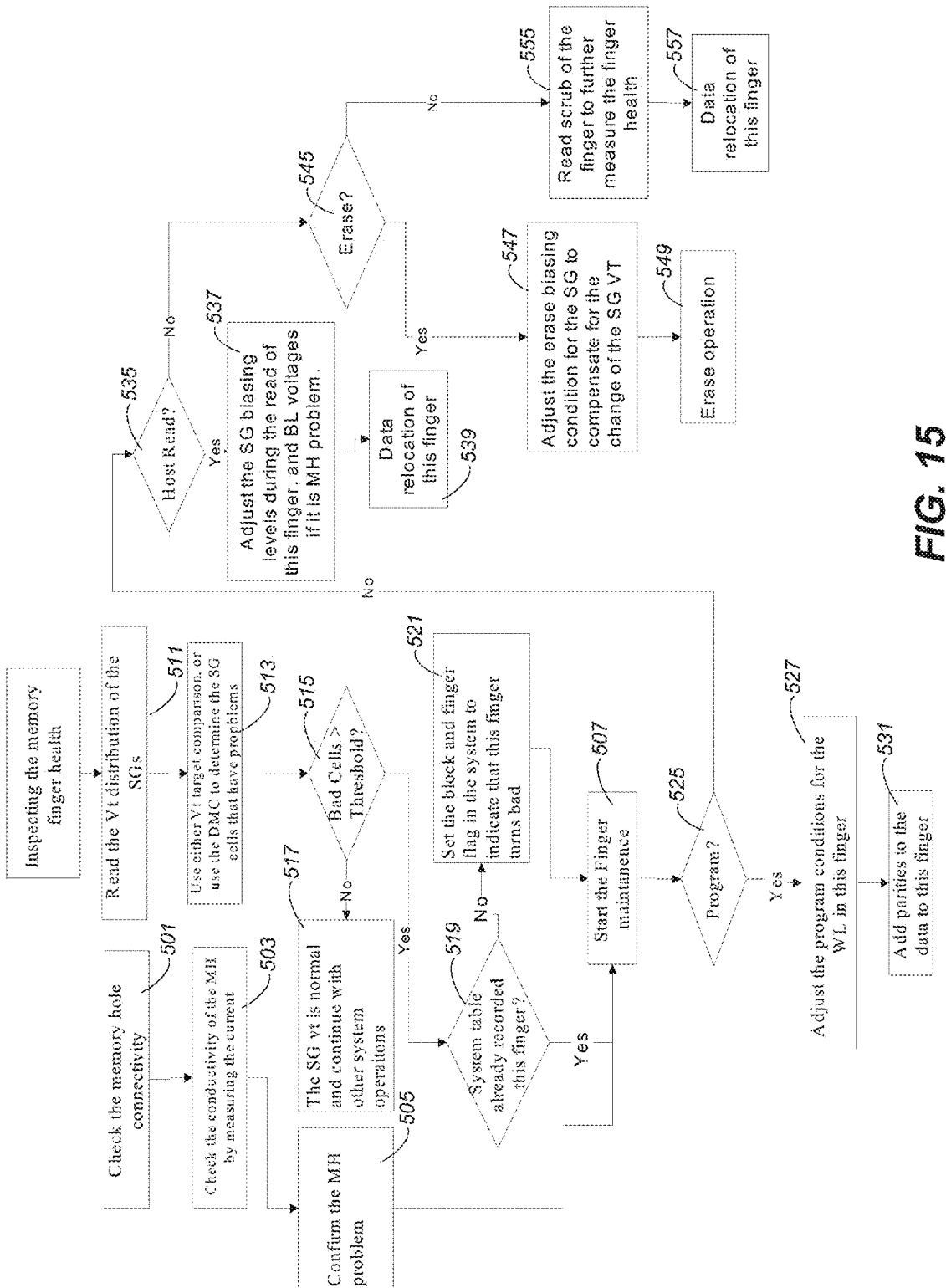
FIG. 15 shows an example of a scheme for inspection and maintenance of separately-selectable sets of NAND strings.

FIG. 15 illustrates an example of a scheme that inspects portions of a three dimensional NAND block and applies certain maintenance steps accordingly. In an inspection routine directed to memory hole connectivity, the conductivity of a memory hole ("MH") is checked 501 by measuring conductivity of the memory hole 503 after memory cells are checked to ensure they are adequately erased. If the memory hole has a low current (high resistance) then a memory hole problem is confirmed 505 and finger maintenance is initiated 507 (the term "finger" may be applied to a separately-selectable set of NAND strings which extend in parallel like a set of fingers). In another inspection routine, the threshold voltage ($V_T$) distributions of the select gates are determined 511 and compared with a target threshold voltage range 513 to identify problems. Alternatively, the number of logic 1 and logic 0 bits read may be counted (e.g. by a Direct Memory Counter "DMC") to identify select transistors that have problems. If the number of bad strings (strings with select gates having threshold voltages outside the desired range) is not greater than a threshold 515 then the portion of the block may be considered normal and may be operated with default operating parameters 517. If the number of bad strings exceeds the threshold number 515 then this separately-selectable set of NAND strings may be considered suspect and may be compared with a list of suspect sets for finger maintenance 519. If the finger is not on the list, then it is added to the list 521. During finger maintenance 507, one or more modified operating parameters may be calculated for a separately-selectable set of strings, such as increased bit line voltage, increased select line voltage, increased redundancy ratio, or other parameters.

Subsequently, when the finger is accessed, a determination is made as to whether the access is a program operation 525. If it is a program operation then conditions are adjusted 527 for the word line (WL) being programmed, e.g. by increasing one or more select line voltages and/or increasing one or more bit line voltages and/or applying a higher redundancy ratio to the data being stored by providing additional parity data in the finger 531.

If the operation is not a program operation, then a determination is made as to whether it is a host read operation 535. If it is a host read operation then select gate (SG) and/or bit line (BL) voltages may be adjusted 537 to perform the read. Adjustment may be indicated by a record entry. After data is read and returned to the host, data may be relocated 539 to a safer location (e.g. a finger that does not require adjusted voltages).

If the operation is not a program or host write operation then a determination is made as to whether it is an erase operation 545. If it is an erase operation then select gate (SG) and/or bit line (BL) voltages may be adjusted 547. Adjustment may be indicated by a record entry. The erase operation then proceeds 549 with the adjusted voltages.

If the operation is not a program, host write, or erase operation, then a read scrub operation is performed 555 that measures the health of the finger, e.g. measures the number of cells that have some level of disturbance and may measure the amount of disturbance. Read scrub may be performed with modified parameters such as select line voltages and bit line voltages. The data is relocated 557 to another location (using ECC to correct any errors in the data).

Figure 16:
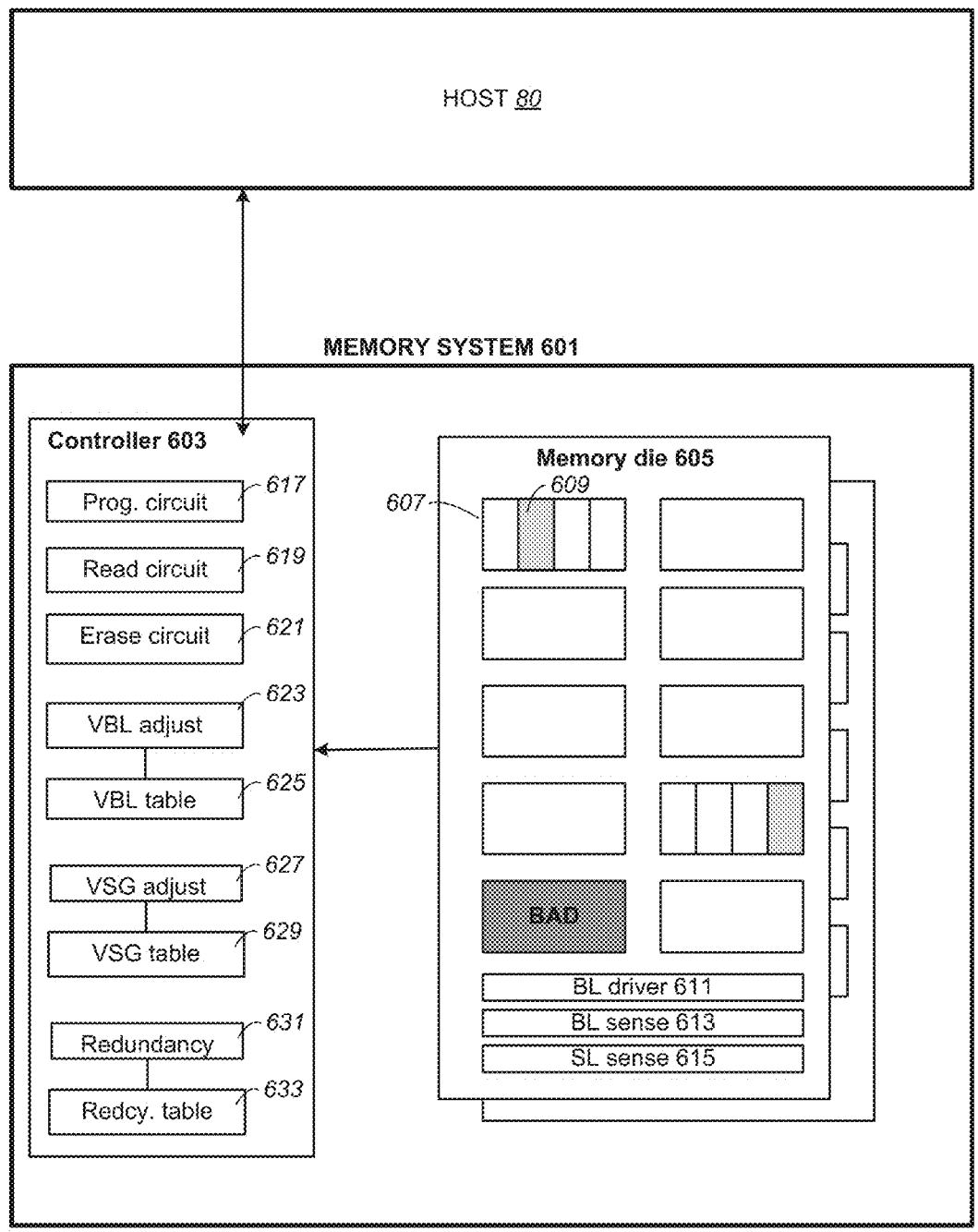
FIG. 16 illustrates an example of a memory system.

FIG. 16 shows an example of components of a memory system 601 connected to host 80. Memory system 601 includes memory controller 603 and memory die 605 (and additional memory dies). Memory die 605 includes a number of individually-erasable 3-D NAND flash memory blocks. Each block has multiple separately-selectable sets of NAND strings. Some blocks are identified as bad blocks ("BAD") and are not used. Some blocks have at least one separately-selectable set of NAND strings that does not meet some criteria (e.g. block 607 contains four separately-selectable sets of NAND strings with string 609 failing to meet some criteria). Memory die 605 also includes bit line driver 611, which is configurable to apply different bit line voltages when accessing different separately-selectable sets of NAND strings (e.g. applying a higher bit line voltage when accessing string 609). Bit line sensing unit 613 is configured to sense bit line current and compare bit line current with a threshold current. Select line sensing unit 615 is configured to sense select line threshold voltage and to compare it with a minimum threshold voltage. Memory controller 603 includes a programming circuit 617, a reading circuit 619, and an erase circuit 621 which may control access to memory die 605 in combination with peripheral circuits in memory die 605. A bit line voltage (VBL) adjustment unit 623 is configured to apply different bit line voltages to different separately-selectable sets of NAND strings (in combination with bit line driver 611). Bit line voltage adjustment unit 623 is in communication with a bit line voltage table 625, which records bit line voltages (or offsets) to be used when accessing different separately-selectable NAND strings. A select gate voltage (VSG) adjustment unit 627 is configured to apply different select line voltages to different separately-selectable sets of NAND strings in a block (e.g. applying higher select line voltage to string 609 than other strings of block 607) in combination with peripheral circuits in memory die 605. Select gate voltage adjustment unit 627 is in communication with select gate voltage table 629, which records different select gate voltages (or offsets) for different sets of strings. Adaptive redundancy unit 631 is configured to apply different redundancy ratios to data stored in different areas of a memory block (e.g. higher redundancy ratio to data stored in separately-selectable set of NAND strings 609 than other sets in block 607). An adaptive redundancy unit may include an ECC engine with variable redundancy. An adaptive redundancy unit may include different components to apply different schemes (e.g. an ECC engine and an XOR circuit). Adaptive redundancy unit 631 is in communication with redundancy table 633, which records redundancy ratios to be used for data stored in different portions of a block.

CONCLUSION

The foregoing detailed description has been presented for purposes of illustration and description. It is not intended to be exhaustive or to limit the attached claims. Many modifications and variations are possible in light of the above teaching.

It is claimed:

1. A three dimensional nonvolatile memory system comprising:
   a block that contains a plurality of separately-selectable sets of NAND strings;
   a bit line current sensing unit that is configured to sense bit line current for a separately-selectable set of NAND strings of the block and to compare the bit line current to a minimum current; and
   a bit line voltage adjustment unit that is in communication with the bit line current sensing unit, the bit line voltage adjustment unit configured to apply a first bit line voltage to separately-selectable sets of NAND strings that have bit line currents greater than the minimum current, and configured to apply a second bit line voltage to separately-selectable sets of NAND strings that have bit line currents less than the minimum current, the second bit line voltage being greater than the first bit line voltage.

2. The three dimensional nonvolatile memory of claim 1 wherein the first and second bit line voltages are applied during programming, reading, or erasing of the block.

3. The three dimensional nonvolatile memory of claim 1 wherein the bit line current sensing unit is configured to sense bit line current for each of the plurality of separately-selectable sets of NAND strings of the block and to compare each of the bit line currents with the minimum current, and wherein the bit line voltage adjustment unit is configured to apply at least the second bit line voltage to any of the plurality of separately-selectable sets of NAND strings in the block that have bit line currents that are less than the minimum current.

4. The three dimensional nonvolatile memory of claim 3 further comprising a table that records an entry for each separately-selectable set of NAND strings that receives at least the second bit line voltage, an entry indicating a bit line voltage to be applied to a corresponding separately-selectable set of NAND strings.

5. The three dimensional nonvolatile memory of claim 1 further comprising: a select line voltage sensing unit that is configured to sense select line threshold voltage and to compare a select line threshold voltage with a minimum threshold voltage; and
  a select line voltage adjustment unit that is configured to adjust select line voltage for a select line that has a select line threshold voltage that is less than the minimum threshold voltage.

6. The three dimensional nonvolatile memory of claim 5 further comprising a table that records an entry for each separately-selectable set of NAND strings that has a select line threshold voltage that is less than the minimum threshold voltage, an entry in the table indicating a select line voltage to be applied to a select line in a corresponding separately-selectable set of NAND strings.

7. The three dimensional nonvolatile memory of claim 1 further comprising an adaptive data encoding unit that encodes data with variable redundancy prior to storage, the adaptive data encoding unit configured to apply a first redundancy scheme to data stored in separately-selectable sets of NAND strings that have bit line currents greater than the minimum current, and configured to apply a second redundancy scheme to data stored in separately-selectable sets of NAND strings that have bit line currents less than the minimum current.

8. The three dimensional nonvolatile memory of claim 7 further comprising a table that records an entry for each separately-selectable set of NAND strings that has bit line currents less than the minimum current, an entry in the table indicating a redundancy scheme to be applied to data stored in a corresponding separately-selectable set of NAND strings.

9. A three dimensional nonvolatile memory comprising:
  a first separately-selectable set of NAND strings in a block, data in the first separately-selectable set of NAND strings encoded with a first level of redundancy; and
  a second separately-selectable set of NAND strings in the block, data in the second separately-selectable set of NAND strings encoded with a second level of redundancy that provides a higher level of error correction capability than the first level of redundancy.

10. The three dimensional nonvolatile memory of claim 9 further comprising an adaptive encoder/decoder that is configured to encode and decode data with a variable level of redundancy according to characteristics of separately-selectable sets of NAND strings in which data is stored.

11. The three dimensional nonvolatile memory of claim 10 further comprising a bit line adjustment unit that is configured to apply a first bit line voltage to bit lines in the first separately-selectable set of NAND strings and to apply a second bit line voltage to bit lines in the second separately-selectable set of NAND strings.

12. The three dimensional nonvolatile memory of claim 11 wherein configuration of the adaptive encoder/decoder, and configuration of the bit line adjustment unit to apply the first bit line voltage and the second bit line voltage, are in response to testing of the first and second separately-selectable sets of NAND strings.

13. The three dimensional nonvolatile memory of claim 9 further comprising a select line adjustment unit that is configured to apply a first select voltage to a first select line in the first separately-selectable set of NAND strings and to apply a second select voltage to a second select line in the second separately-selectable set of NAND strings.

14. The three dimensional nonvolatile memory of claim 9 wherein the first level of redundancy and the second level of redundancy are determined according to characteristics of the first separately-selectable set of NAND strings and the second separately-selectable set of NAND strings respectively.

15. A method of operating a three dimensional nonvolatile memory that includes multiple separately-selectable sets of NAND strings in a block, comprising:
  measuring electrical current through a separately-selectable set of NAND strings having a common select line;
  comparing the electrical current with predetermined criteria;
  if the current does not meet the predetermined criteria then calculating one or more bit line voltage offsets; and
  subsequently, adjusting bit line voltages applied to bit lines connected to the separately-selectable set of NAND strings by the one or more bit line voltage offsets while other bit line voltages applied to other separately-selectable sets of NAND strings remain unadjusted.

16. The method of claim 15 further comprising recording the one or more bit line voltage offsets for the separately-selectable set of NAND strings.

17. The method of claim 15 wherein the one or more bit line voltage offsets are recorded in a table that contains a calculated bit line voltage offset for each separately-selectable set of NAND strings having a measured current that does not meet the predetermined criteria.

18. The method of claim 15 further comprising applying an enhanced redundancy scheme to data stored in sets of strings that do not meet the predetermined criteria, the enhanced redundancy scheme providing a higher degree of error correction capacity than a regular redundancy scheme that is applied to data stored in sets of strings that meet the predetermined criteria.

19. The method of claim 15 further comprising sensing select gate threshold voltage for a select line in a separately-selectable set of NAND strings;
  comparing the select gate threshold voltage with a minimum threshold voltage;
  calculating a select line voltage offset for a separately-selectable set of NAND strings that have a select line threshold voltage less than the minimum threshold voltage; and
  applying the select line voltage offset to select line voltages that are subsequently applied to the select line when accessing the separately-selectable set of NAND strings.

20. The method of claim 19 further comprising recording the select line voltage offset for the separately-selectable set of NAND strings and recording additional select line voltage offsets for other separately-selectable sets of NAND strings.

21. The method of claim 20 further comprising encoding data to be stored in the separately-selectable set of NAND strings using an enhanced encoding scheme.

* * * * *